US008293646B2

(12) United States Patent
Ozaki et al.

(10) Patent No.: US 8,293,646 B2
(45) Date of Patent: Oct. 23, 2012

(54) SEMICONDUCTOR DEVICE MANUFACTURING METHOD AND SUBSTRATE PROCESSING APPARATUS

(75) Inventors: Takashi Ozaki, Toyama (JP); Osamu Kasahara, Toyama (JP); Takaaki Noda, Toyama (JP); Kiyohiko Maeda, Imizu (JP); Atsushi Moriya, Toyama (JP); Minoru Sakamoto, Tsukuba (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 1003 days.

(21) Appl. No.: 11/667,078

(22) PCT Filed: Nov. 2, 2005
(Under 37 CFR 1.47)

(86) PCT No.: PCT/JP2005/020239
§ 371 (c)(1),
(2), (4) Date: Oct. 21, 2008

(87) PCT Pub. No.: WO2006/049225
PCT Pub. Date: May 11, 2006

(65) Prior Publication Data
US 2009/0117752 A1     May 7, 2009

(30) Foreign Application Priority Data

Nov. 8, 2004  (JP) .................................. 2004-324067
Sep. 7, 2005  (JP) .................................. 2005-259894

(51) Int. Cl.
*H01L 21/02* (2006.01)

(52) U.S. Cl. ........ 438/677; 438/509; 438/795; 438/758; 438/906; 110/191; 257/E21.002

(58) Field of Classification Search ................... 438/906, 438/795, 677, 509, 758; 110/191; 257/E21.002
See application file for complete search history.

(56) References Cited

U.S. PATENT DOCUMENTS
6,630,024 B2 * 10/2003 Schmolke et al. ............ 117/106
(Continued)

FOREIGN PATENT DOCUMENTS
JP          5-102187          4/1993
(Continued)

OTHER PUBLICATIONS

Japanese Office Action dated Jul. 27, 2010 with its English translation.

(Continued)

*Primary Examiner* — Tom Thomas
*Assistant Examiner* — Benjamin Tzu-Hung Liu
(74) *Attorney, Agent, or Firm* — Kratz, Quintos & Hanson, LLP

(57) ABSTRACT

A high quality interface is formed at a low oxygen-carbon density between a substrate and a thin film while preventing heat damage on the substrate and increase of thermal budget. This method includes a step of loading a wafer into a reaction furnace, a step of pretreating the wafer in the reaction furnace, a step of performing a main processing of the pretreated wafer in the reaction furnace, and a step of unloading the wafer from the reaction furnace after the main processing. Hydrogen gas is continuously supplied to the reaction furnace in the period from the end of the pretreating step to the start of the main processing and at least during vacuum-exhausting an interior of the reaction furnace.

13 Claims, 19 Drawing Sheets

U.S. PATENT DOCUMENTS

| | | | |
|---|---|---|---|
| 6,753,258 B1 * | 6/2004 | Gaillard et al. | 438/691 |
| 6,911,391 B2 * | 6/2005 | Yang et al. | 438/653 |
| 7,005,372 B2 * | 2/2006 | Levy et al. | 438/627 |

FOREIGN PATENT DOCUMENTS

| | | |
|---|---|---|
| JP | 6-69131 | 3/1994 |
| JP | 6-302566 | 10/1994 |
| JP | 9-27457 | 1/1997 |
| JP | 2000-182967 | 6/2000 |
| JP | 2002-8994 | 1/2002 |
| JP | 2003-197547 | 7/2003 |
| WO | WO 2004/044970 A1 | 5/2004 |

OTHER PUBLICATIONS

Japanese Office Action dated Apr. 6, 2010 with its English translation.

* cited by examiner

SEMICONDUCTOR DEVICE MANUFACTURING METHOD AND SUBSTRATE PROCESSING APPARATUS

TECHNICAL FIELD

The present invention relates to a semiconductor device manufacturing method and substrate processing apparatus, and is effective for example in use for processes for forming thin films on semiconductor wafers (hereafter called wafers) for forming a semiconductor integrated circuit device containing semiconductor devices in methods for manufacturing a semiconductor integrated circuit device (hereafter called IC), and relates in particular to technology for forming a high quality interface between the silicon wafer and the thin film.

BACKGROUND ART

In IC manufacturing methods, thin films are formed on wafers by the depressurizing CVD (chemical vapor deposition) method.

In recent years, in order to resolve problems when loading the wafer into the reaction furnace such as semiconductor deterioration due to impurities adhering to the semiconductor or an increase in the natural oxidation film, a method is utilized where a prechamber is installed at a stage prior to the reaction furnace; and oxygen and moisture are removed in sufficient amounts from the prechamber, and after replacing the prechamber atmosphere with nitrogen gas, the wafers are loaded into the reaction furnace.

A vertical type depressurizing CVD apparatus with reaction furnace prechamber (hereafter called, CVD apparatus with prechamber) is widely utilized to implement the depressurizing CVD method.

In this CVD apparatus with prechamber, a prechamber with a sealed structure that allows drawing a vacuum is installed at a stage prior to the reaction furnace.

Prior to processing, the wafers are loaded into the prechamber from a wafer loading/unloading opening and set in a boat serving as the wafer processing jig. The prechamber is then sealed in an airtight state, and oxygen and moisture removed by drawing a vacuum and purging with nitrogen gas repeatedly. The wafers are then loaded from the prechamber into the reaction furnace by the boat (boat loading).

However, a drive shaft unit and boat rotator mechanism and a wiring unit are installed within the prechamber in the CVD apparatus with prechamber to load the wafers and the boat into the reaction furnace. These components might possibly contaminate the wafer surface with impurities such as organic substances while drawing a vacuum.

A hydrogen ($H_2$) annealing method was utilized in the reaction furnace where the wafers are loaded, as a technique using reactive gas to remove impurities or the natural oxidation film on the wafer.

An example of this technology is disclosed in the patent document 1.

Patent document 1: Japanese Patent Non-examined Publication No. 5-29309

DISCLOSURE OF THE INVENTION

Problems to be Solved by the Invention

However, this hydrogen annealing method typically required a high processing temperature of 900 to 1000° C., causing the potential problem of an increased thermal budget and heat damage to the IC.

On the other hand, in forming a high quality interface with a low oxygen and low carbon density between the semiconductor wafer and thin film, it is essential that any contaminants on the wafer surface be kept to a minimum in the process from wafer loading into the CVD apparatus with prechamber, up to the just before the film forming in the reaction furnace.

More specifically, suppressing contamination on the wafer surface due to organic substances from the drive shaft unit and boat rotator mechanism and wiring unit is essential in the prechamber during nitrogen purge prior to wafer loading into the reaction furnace and during wafer unloading from the reaction furnace.

Contamination from the furnace opening of the comparatively low temperatures must also be suppressed inside the reaction furnace.

Further, the atmosphere within the furnace must be of high purity and the contaminant substances adhering to the surface must be reduced and removed until forming the thin film on the wafer.

The present invention therefore has the object of providing a semiconductor device manufacturing method and substrate processing apparatus capable of forming a high quality interface with a low oxygen and low carbon density between a substrate and a thin film while preventing heat damage to the substrate and an increased thermal budget.

Means to Solve the Problems

Typical aspects among the means to resolve the above mentioned problems, are given as follows.
(1) A method for manufacturing semiconductor devices comprising the steps of:
loading a substrate into a reaction furnace,
supplying pretreating gas into the reaction furnace and pretreating the substrate,
supplying process gas into the reaction furnace and performing a main processing of the pretreated substrate, and
unloading the substrate from the reaction furnace after the main processing, wherein
hydrogen gas is continuously supplied into the reaction furnace at least during vacuum-exhausting an interior of the reaction furnace in the period from the end of the pretreating to the start of the main processing.
(2) The method for manufacturing semiconductor devices according to the first aspect (1), wherein hydrogen gas is continuously supplied into the reaction furnace in the period between the end of the pretreating and the start of the main processing.
(3) The method for manufacturing semiconductor devices according to the first aspect (1), wherein the temperature inside the reaction furnace is set to a first temperature during the pretreating, and is set to a second temperature different from the first temperature during the main processing.
(4) The method for manufacturing semiconductor devices according to the first aspect (1), further containing a step of raising the temperature inside the reaction furnace to the pretreating temperature after loading the substrate into the reaction furnace, wherein the pretreating gas is supplied into the reaction furnace in this temperature raising step.
(5) The method for manufacturing semiconductor devices according to the first aspect (1), wherein the pretreating is performed while raising the temperature in the reaction furnace.

(6) The method for manufacturing semiconductor devices according to the first aspect (1), wherein the temperature inside the reaction furnace is set between 200° C. and 430° C. during the pretreating, and the pressure inside the reaction furnace is set between 1 Pa and 10 Pa.

(7) The method for manufacturing semiconductor devices according to the first aspect (1), wherein silane type gas is supplied into the reaction furnace as the pretreating gas in the pretreating step.

(8) The method for manufacturing semiconductor devices according to the first aspect (1), wherein gas containing silicon atoms and gas containing chlorine atoms are alternately supplied into the reaction furnace as the pretreating gas in the pretreating step.

(9) A method for manufacturing semiconductor devices comprising the steps of:
loading a substrate into a reaction furnace,
raising the temperature inside the reaction furnace to a pretreating temperature,
supplying pretreating gas into the reaction furnace raised to the pretreating temperature and pretreating the substrate,
supplying process gas into the reaction furnace and performing a main processing of the pretreated substrate, and
unloading the substrate from the reaction furnace after the main processing, wherein
the pretreating gas is supplied into the reaction furnace in the step of raising the temperature inside the reaction furnace up to the pretreating temperature.

(10) A method for manufacturing semiconductor devices comprising the steps of:
loading a substrate into a reaction furnace,
supplying pretreating gas into the reaction furnace and pretreating the substrate,
supplying process gas into the reaction furnace and performing a main processing of the pretreated substrate, and
unloading the substrate from the reaction furnace after the main processing, wherein
the pretreating is performed while raising the temperature inside the reaction furnace.

(11) A method for manufacturing semiconductor devices comprising the steps of:
loading a substrate into a reaction furnace,
pretreating the substrate in the reaction furnace,
performing a main processing of the pretreated substrate in the reaction furnace, and
unloading the substrate from the reaction furnace after the main processing, wherein
gas containing silicon atoms and gas containing chlorine atoms are alternately supplied into the reaction furnace in the pretreating step.

(12) The method for manufacturing semiconductor devices according to the eleventh aspect (11), wherein in the pretreating step, the temperature inside the reaction furnace is set to a first temperature when supplying gas containing silicon atoms into the reaction furnace, and is set to a second temperature different from the first temperature when supplying gas containing chlorine atoms into the reaction furnace.

(13) The method for manufacturing semiconductor devices according to the twelfth aspect (12), wherein the temperature inside the reaction furnace is set to a third temperature different from the second temperature in the main processing step.

(14) The method for manufacturing semiconductor devices according to the twelfth aspect (12), wherein hydrogen gas is continuously supplied into the reaction furnace when changing the reaction furnace temperature from the first temperature to the second temperature.

(15) The method for manufacturing semiconductor devices according to the thirteenth aspect (13), wherein hydrogen gas is continuously supplied into the reaction furnace when changing the reaction furnace temperature from the first temperature to the second temperature, and when changing the reaction furnace temperature from the second temperature to the third temperature.

(16) The method for manufacturing semiconductor devices according to the eleventh aspect (11), wherein the gas containing silicon atoms is at least one gas selected from among a group made up of monosilane ($SiH_4$) gas and disilane ($Si_2H_6$) gas; and the gas containing chorine atoms is at least one gas selected from among a group made up of hydrogen chloride (HCl) gas and dichlorosilane ($SiH_2Cl_2$) gas.

(17) A method for manufacturing semiconductor devices comprising the steps of:
loading a substrate into a reaction furnace,
supplying pretreating gas into the reaction furnace and pretreating the substrate,
supplying process gas into the reaction furnace and performing a main processing of the pretreated substrate, and
unloading the substrate from the reaction furnace after the main processing, wherein
in the pretreating step, the temperature inside the reaction furnace is set between 200° C. and 430° C., and the pressure inside the reaction furnace is set between 1 Pa and 10 Pa.

(18) A substrate processing apparatus comprising:
a reaction furnace for processing a substrate,
a pretreating gas supply line for supplying pretreating gas into the reaction furnace,
a hydrogen gas supply line for supplying hydrogen gas into the reaction furnace,
a process gas supply line for supplying process gas into the reaction furnace,
an exhaust line for exhausting an interior of the reaction furnace,
a vacuum pump installed on the exhaust line for vacuum-exhausting the interior of the reaction furnace, and
a controller for performing control to supply pretreating gas into the reaction furnace to perform a pretreating of the substrate, and to supply process gas into the reaction furnace to perform a main processing of the pretreated substrate, as well as to supply continuously hydrogen gas into the reaction furnace at least during vacuum-exhausting the interior of the reaction furnace in the period from the end of the pretreating to the start of the main processing.

(19) A substrate processing apparatus comprising:
a reaction furnace for processing a substrate,
a pretreating gas supply line for supplying pretreating gas into the reaction furnace,
a process gas supply line for supplying process gas into the reaction furnace,
an exhaust line for exhausting an interior of the reaction furnace,
a vacuum pump installed on the exhaust line for vacuum-exhausting the interior of the reaction furnace, and
a controller for performing control to supply pretreating gas into the reaction furnace to perform a pretreating of the substrate after raising the temperature inside the reaction furnace to the pretreating temperature while supplying pretreating gas into the reaction furnace; and to supply process gas into the reaction furnace to perform a main processing of the pretreated substrate.

(20) A substrate processing apparatus comprising:
a reaction furnace for processing a substrate,
a pretreating gas supply line for supplying pretreating gas into the reaction furnace,
a process gas supply line for supplying process gas into the reaction furnace,
an exhaust line for exhausting an interior of the reaction furnace,
a vacuum pump installed on the exhaust line for vacuum-exhausting the interior of the reaction furnace, and
a controller for performing control to supply pretreating gas into the reaction furnace while raising the temperature inside the reaction furnace to perform a pretreating of the substrate; and to supply process gas into the reaction furnace to perform a main processing of the pretreated substrate.

(21) A substrate processing apparatus comprising:
a reaction furnace for processing a substrate,
a silicon inclusion gas supply line for supplying gas containing silicon atoms into the reaction furnace,
a chlorine inclusion gas supply line for supplying gas containing chlorine atoms into the reaction furnace,
a process gas supply line for supplying process gas into the reaction furnace,
an exhaust line for exhausting an interior of the reaction furnace,
a vacuum pump installed on the exhaust line for vacuum-exhausting the interior of the reaction furnace, and
a controller for performing control to supply alternately gas containing silicon atoms and gas containing chlorine atoms into the reaction furnace to perform a pretreating of the substrate, and to supply process gas into the reaction furnace to perform a main processing of the pretreated substrate.

(22) A substrate processing apparatus comprising:
a reaction furnace for processing a substrate,
a pretreating gas supply line for supplying pretreating gas into the reaction furnace,
a process gas supply line for supplying process gas into the reaction furnace,
an exhaust line for exhausting an interior of the reaction furnace,
a vacuum pump installed on the exhaust line for vacuum-exhausting the interior of the reaction furnace, and
a controller for performing control to supply pretreating gas into the reaction furnace to perform a pretreating of the substrate in a state where the temperature inside the reaction furnace is set between 200° C. and 430° C., and the pressure inside the reaction furnace is set between 1 Pa and 10 Pa; and to supply processing gas into the reaction furnace to perform a main processing of the pretreated substrate.

Effect of the Invention

The first aspect (1) of the invention renders the effect that a satisfactory cleaning effect can be obtained at a low temperature so that an increased thermal budget and heat damage to the substrates can be prevented to form a high quality interface with a low-oxygen and low-carbon density between a substrate and a thin film.

BEST MODE FOR CARRYING OUT THE INVENTION

Figure 1:
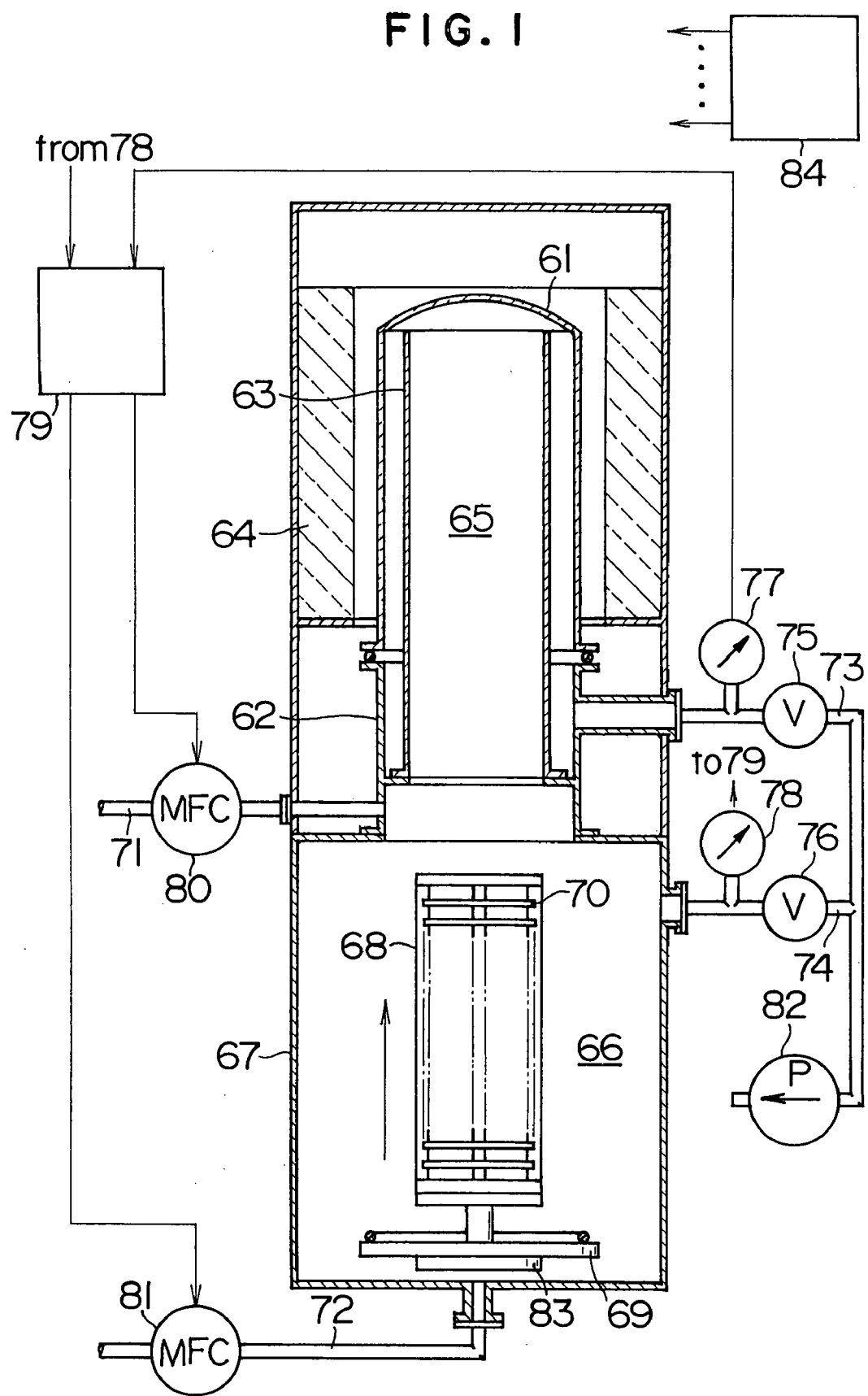
FIG. 1 is an outline cross sectional view showing the substrate processing apparatus of one embodiment of this invention.

An embodiment of this invention is described as follows while referring to the drawings.

The overall substrate processing apparatus comprising a vertical type reaction furnace of this embodiment is described while referring to FIG. 1.

A reaction tube 61 is mounted on the furnace opening flange 62. An inner tube 63 is supported concentrically with the reaction tube 61 on the furnace opening flange (manifold) 62. A tubular heater 64 is mounted so as to enclose the reaction tube 61. The vertical reaction furnace is comprised of the heater 64, reaction tube 61, inner tube 63, and the furnace opening flange, etc.

The interior of the reaction tube 61 (inner tube 63) forms an airtight reaction chamber 65. An airtight prechamber 66 connects to the reaction chamber 65. The prechamber 66 is made up of a load-lock chamber 67 connected to the furnace opening flange 62.

A boat elevator 83 serving as the furnace loading/unloading means is installed in the load-lock chamber 67. The boat elevator 83 loads and unloads the substrate support jig 68 (hereafter, called boat 68) into/from the reaction chamber 65.

A furnace opening lid 69 seals the reaction chamber 65 in an air-tight state with the boat 68 loaded inside.

A gate valve (not shown in drawing) is installed in the load-lock chamber 67, and wafer transfer equipment (not shown in drawing) is installed outside the load-lock chamber 67.

The boat 68 is lowered (pulled out) and stored in the load-lock chamber 67 and substrates 70 such as silicon wafers (hereafter called wafers 70) are transferred by the wafer transfer equipment via the gate valve to the boat 68.

A first gas supply line 71 connects to the furnace opening flange 62. The first gas supply line 71 supplies gas from the lower part of the inner tube 63 into the reaction chamber 65. A second gas supply line 72 connects to the load-lock chamber 67.

A first exhaust line 73 connects to the furnace opening flange 62, and a second exhaust line 74 connects to the load-lock chamber 67. The first exhaust line 73 and the second exhaust line 74 connect via a first air valve 75 and a second air valve 76 to a vacuum pump 82 serving as the exhaust device.

A first pressure sensor 77 is installed on the first exhaust line 73, and a second pressure sensor 78 is installed on the second exhaust line 74. The first pressure sensor 77 and the second pressure sensor 78 input pressure sensing results into a pressure controller unit 79.

A first flow control unit (mass flow controller) 80 is installed on the first gas supply line 71. A second flow control unit 81 is installed on the second gas supply line 72. The pressure controller unit 79 commands the first flow control unit 80 and the second flow control unit 81 to regulate the flow rate of gas supplied from the first gas supply line 71 to the reaction chamber 65, and to regulate the flow rate of gas supplied from the second gas supply line 72 to the prechamber 66.

The pressure controller unit 79 can set the reaction chamber 65 and the prechamber 66 to a vacuum or depressurized state by closing the first flow control unit 80 and the second flow control unit 81, stopping the supply of gas, opening the first air valve 75 and the second air valve 76, and drawing a vacuum by using the vacuum pump 82.

The pressure sensing signals from the first pressure sensor 77 and the second pressure sensor 78 are fed back to the pressure controller unit 79, while the first air valve 75 and the second air valve 76 are open and a vacuum has been drawn by the vacuum pump 82.

The pressure controller unit 79 regulates the first flow control unit 80 and the second flow control unit 81 and adjusts the gas supply flow rate so that the pressure detected by the first pressure sensor 77 and the second pressure sensor 78 becomes to a setting pressure.

The gas supplied in the pressure adjustment process and maintenance process is an inert gas such as nitrogen gas utilized to inhibit the forming of an oxide film on the substrates.

Gas via two circuits made up of the first gas supply line 71 and the second gas supply line 72 is supplied into the reaction chamber 65 and the prechamber 66. Gas is exhausted via two circuits made up of the first exhaust line 73 and the second exhaust line 74.

Since the reaction chamber 65 can be opened and closed, the pressure inside the prechamber 66 and the reaction chamber 65 can be separately controlled and managed. Moreover, the pressure in the prechamber 66 and the reaction chamber 65 can be controlled and managed as one chamber while mutually connected.

The reference numeral 84 denotes a controller. The controller 84 is structured to control the operation of the each unit making up the above described substrate processing apparatus.

The method for processing the wafers is described next utilizing the above described substrate processing apparatus as one process of the semiconductor device manufacturing process. Here, a method for forming film such as D-polysilicon film (phosphorus dope polysilicon film) on the wafer is described as the first embodiment of the process sequence including the pretreating step.

In the following description, the controller 84 controls each unit making up the substrate processing apparatus.

The temperature inside the reactor chamber 65 is for example maintained at a fixed temperature of 530° C. during the forming of the D-polysilicon film (phosphorus dope polysilicon film).

However, prior to film-forming event in this embodiment, pretreating by purging with gas containing monosilane ($SiH_4$) is performed at a lower temperature than the film-forming temperature, in order to remove by reduction the tiny amount of natural oxidized film formed on the substrate.

The temperature within the reaction chamber 65 is therefore maintained at a fixed temperature between 200° C. and 430° C. in order to perform pretreating prior to wafer loading.

The wafers 70 are loaded into the boat 68 stored inside the prechamber 66 in a state where the reaction chamber 65 is closed, and the reaction chamber 65 and the prechamber 66 are both raised to a high vacuum state after the prechamber 66 is closed.

The drawing of a vacuum as referred to here, indicates a state where a container is exhausted to a vacuum via the exhaust line, while the supply of gas is stopped, and the pressure while the vacuum is drawn is lower than the pressure during film-forming. Raising the vacuum to a high level inhibits the formation of a natural oxidation film on the wafers 70.

The pressure controller unit 79 regulates the first flow control unit 80 and the second flow control unit 81 to supply inert gas into the reaction chamber 65 and the prechamber 66 and to control the pressure in the reaction chamber 65 and the prechamber 66 between 650 Pa and 3,000 Pa.

The reaction chamber 65 is opened in a state where the pressure in the atmosphere is between 650 Pa and 3,000 Pa, and the boat 68 is loaded into the reaction chamber 65 maintained at the pretreating temperature.

The temperature of the reaction chamber 65 drops due to opening the reaction chamber 65 and loading the boat 68.

During temperature recovery to raise (recover) the furnace temperature that dropped during loading of the boat 68 back to the pretreating temperature, the pressure controller unit 79 regulates the pressure between 1,300 Pa and 3,000 Pa via the first flow control unit 80.

The pretreating step is performed when the temperature within the reaction chamber 65 recovers back to the pretreating temperature and stabilizes there.

In the pretreating step, the first gas supply line 71 supplies via the first flow control unit 80, a gas containing $SiH_4$ identical to the gas for forming the D-polysilicon film (phosphorus dope polysilicon film), into the reaction chamber 65 (hereafter called $SiH_4$ purging).

Under certain conditions, $SiH_4$ intensifies the reduction effect due to the decomposed hydrogen and the SiHx more than film-forming. Under conditions where the reducing effect becomes stronger, performing the $SiH_4$ purge reduces and eliminates the natural oxidation film formed on the wafer 70.

Besides gas made up of 100 percent $SiH_4$, gas including $SiH_4$ diluted with inert gas such as nitrogen ($N_2$) may also be utilized.

The temperature within the reaction chamber 65 during pretreating step is preferably between 200° C. and 430° C., and the pressure is preferably between 1 Pa and 10 Pa via the partial pressure of $SiH_4$. In other words, the pretreating is preferably implemented under conditions of a pressure and temperature lower than in the main processing step (film forming step) described later.

The time from the wafers entering the furnace until the starting of the $SiH_4$ purge step is preferably within 15 minutes.

Performing $SiH_4$ purge under these type of conditions allows limiting the thermal budget, boosting the $SiH_4$ reducing effect, and also reducing the interfacial oxygen density (concentration) described later on. Moreover, the interfacial contact resistance can be lowered, and the device electrical characteristics can be improved.

The $SiH_4$ purge is implemented at a comparatively low temperature (temperature lower than the temperature that silicon crystallizes) and therefore possesses the advantage that the underlayer does not crystallize (maintains the amorphous state unchanged), and the interfacial oxygen density can be reduced.

A further advantage is that the pretreating step can utilize a gas identical to the film-forming gas so that there is no need to install a separate pretreating gas supply circuit.

When the pretreating step ends, the interior of the reaction chamber 65 is purged with nitrogen gas ($N_2$), and residual gas is removed from the interior of the reaction chamber 65.

The temperature within the reaction chamber 65 is then raised from the temperature between 200° C. and 430° C. in the pretreating step, up to the D-polysilicon film (phosphorus dope polysilicon film)-forming temperature of for example 530° C. The pressure controller unit 79 controls the pressure in the reaction chamber 65 at this time, between 1,300 Pa and 3,000 Pa via the first flow control unit 80.

When the temperature inside the reaction chamber 65 rises to the film-forming temperature and stabilizes, the film-forming process step (hereafter called, film-forming step) that serves as the main process step is implemented.

In the film-forming step, a gas containing $SiH_4$ serving as the film-forming gas, and a gas containing phosphine ($PH_3$) serving as the dopant gas are supplied from the first gas supply line 71 into the reaction chamber 65 via the first flow control unit 80.

The D-polysilicon film (phosphorus dope polysilicon film) is in this way formed on the wafer 70 from whose surface the natural oxidation film was removed in the pretreating step.

Besides gas of 100 percent $SiH_4$ as the gas containing $SiH_4$, a gas made up for example of $SiH_4$ diluted with inert gas such as nitrogen ($N_2$) may also be utilized.

$PH_3$ gas diluted with inert gas such as nitrogen ($N_2$), helium (He), or argon (Ar) is preferably utilized as the gas containing $PH_3$.

The temperature and pressure within the reaction chamber 65 during the film-forming step are preferably higher than the temperature and pressure in the reaction chamber 65 during the pretreating step. This temperature for example is set to approximately 530° C. and the pressure to approximately 10 Pa.

When the film-forming step is complete, the interior of the reaction chamber 65 is nitrogen-purged at lower pressure than the processing pressure, and along with regulating the reaction chamber to a pressure between 650 Pa and 3,000 Pa, the prechamber 66 is controlled to the same pressure as the reaction chamber 65.

The reaction chamber 65 is then opened and the boat 68 is pulled from the reaction chamber 65 into the prechamber 66 while the pressure in the atmosphere is maintained between 650 Pa and 3,000 Pa.

The boat 68 and the wafer 70 are cooled within the prechamber 66.

The load-lock chamber 67 is opened after cooling, the processed wafers 70 are ejected by the wafer transfer equipment (not shown in drawing), and unprocessed wafers 70 are transferred to the boat 68.

In the above embodiment, the pressure in the atmosphere during temperature recovery is regulated between 1,300 Pa and 3,000 Pa, the pressure in the atmosphere during loading of the boat 68 is regulated between 650 Pa and 3,000 Pa, the pressure in the atmosphere during the rise from the pretreating temperature to the film-forming temperature is regulated between 1,300 Pa and 3,000 Pa. The frictional force between the wafer support section of the boat 68 and the wafer 70 can therefore be reduced compared to a high-intensity vacuum, and the generation of particles can be reduced even when a displacement occurs between the wafer and boat during loading of the boat, when raising the temperature, or during temperature recovery.

In the above embodiment, the case of forming a D-polysilicon film (phosphorus dope silicon film) on the wafer was described. However, this invention is not limited to that case, and may be utilized in the case of forming other films of different types.

In the above embodiment, the case of utilizing an apparatus containing a vertical reaction furnace was described. However, this invention is not limited to that case, and may be applied in the case of utilizing a device containing a single wafer type reaction furnace.

First Embodiment

Experiments performed for determining pressure dependence and temperature dependence of the interfacial oxygen density (concentration) in $SiH_4$ purge are described next for the first embodiment.

The electrodes extending from the DRAM source and drain are used as one example of a semiconductor device requiring a low oxygen density interface. This interfacial characteristic is referred to as contact resistance. The thinner the natural oxidized film in this section, the less the contact resistance and the better the electrical characteristics.

In the experiment to evaluate this embodiment, the interfacial characteristics between the D-polysilicon film (phosphorus dope silicon film) and D-polysilicon film (phosphorus dope silicon film), were measured with SIMS (Secondary Ionization Mass Spectrometer).

The evaluation device was the apparatus of the above embodiment. In other words, a load-lock type apparatus effective in reduction of the interfacial oxygen density was used.

Several types of samples for evaluation were fabricated by changing the temperature and pressure of the $SiH_4$ purge conditions utilizing the apparatus and method of the above embodiment.

Figure 2:
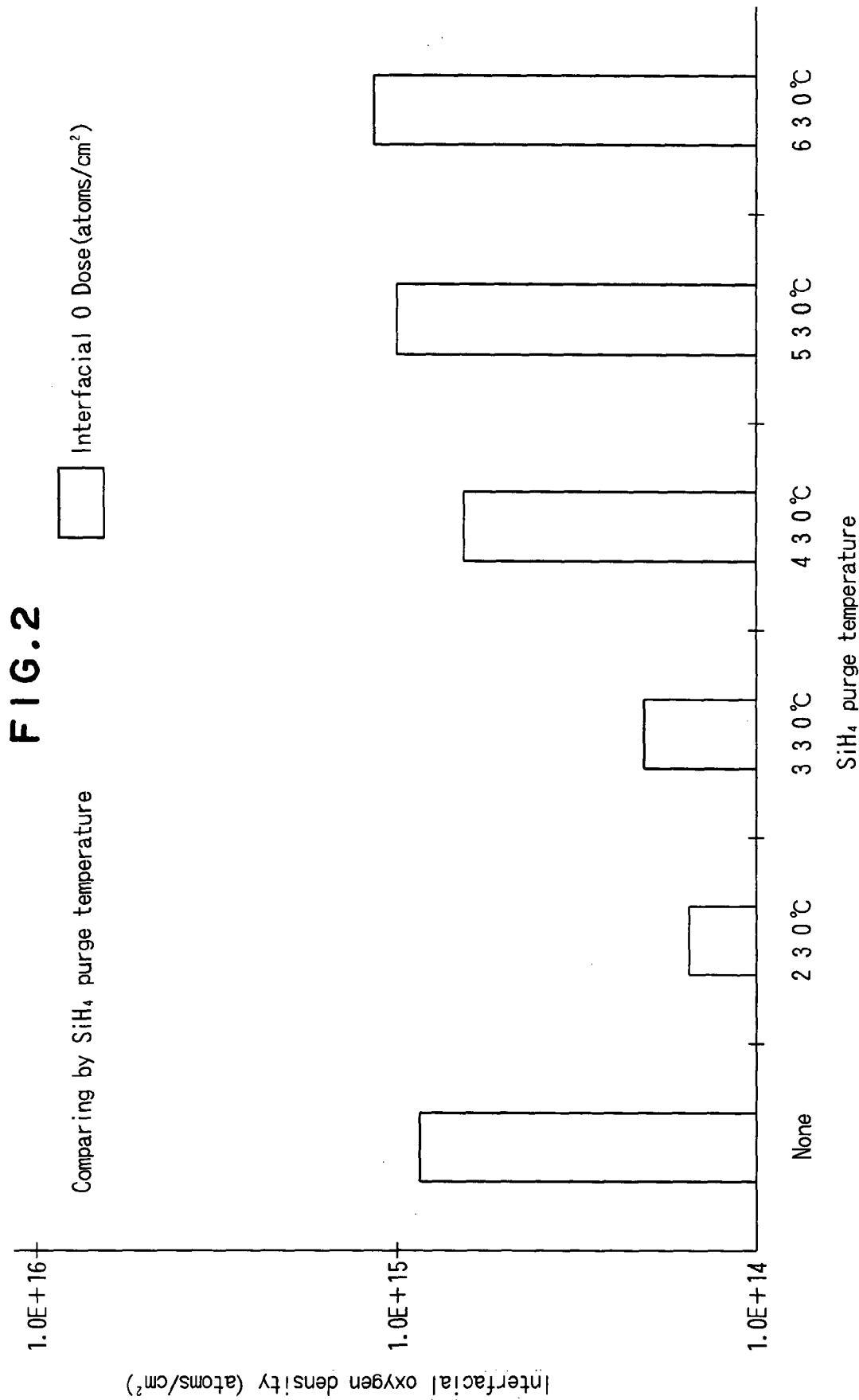
FIG. 2 is a diagram showing the $SiH_4$ purge temperature dependence of the interfacial oxygen density (SIMS results) in the first embodiment of this invention.

FIG. 2 shows the $SiH_4$ purge temperature dependence of the interfacial oxygen density (SIMS results).

The horizontal axis in the figure shows the $SiH_4$ purge temperature (° C.) and the vertical axis shows the interfacial oxygen density (atoms/cm$^2$).

As shown in FIG. 2, for this evaluation, the $SiH_4$ purge temperature was changed to 230° C., 330° C., 430° C., 530° C., and 630° C. The furnace pressure was set to 10 Pa.

The "None" in the figure is indicated when no $SiH_4$ purge was performed.

In FIG. 2, it can be seen that the lower the $SiH_4$ purge temperature, the higher the effect.

One can see that lowering the $SiH_4$ purge temperature to 430° C. or less in particular can drastically lower the interfacial oxygen density (at least 34.7% or more) more than when set to 530° C. (same temperature as the film-forming temperature).

This figure also clearly shows that the $SiH_4$ purge is effective in drastically lowering the interfacial oxygen density (at least 27.3% or more) compared to when no $SiH_4$ purge was performed.

Figure 3:
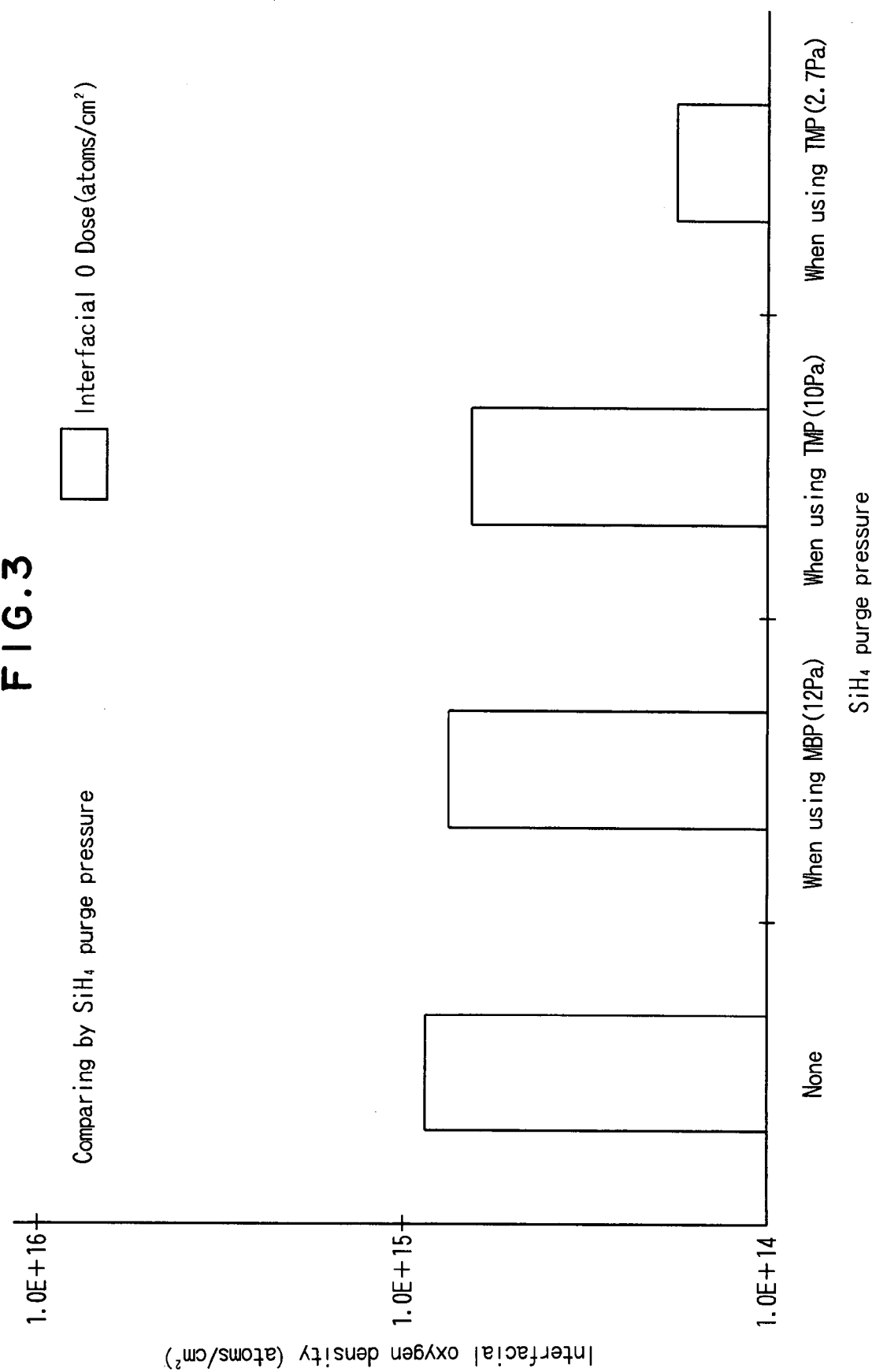
FIG. 3 is a diagram showing the $SiH_4$ purge pressure dependence of the interfacial oxygen density (SIMS results) in the first embodiment of this invention.

The $SiH_4$ purge pressure dependency of the interfacial oxygen density (SIMS results) is shown in FIG. 3.

The horizontal axis indicates the $SiH_4$ purge pressure ($SiH_4$ partial pressure). The vertical axis indicates the interfacial oxygen density (atoms/cm²).

The evaluation was carried out for the three cases as shown in FIG. 3, when the $SiH_4$ purge pressure was depressurized (12 Pa) using a mechanical booster pump (hereafter called, MBP); when depressurized (10 Pa) using a turbo molecular pump (hereafter called, TMP); and when depressurized (2.7 Pa) using a TMP. The $SiH_4$ purge temperature was set to 430° C.

The "None" in the figure is indicated when no $SiH_4$ purge was implemented.

FIG. 3 shows that performing $SiH_4$ purge at the depressurized pressure of 12 Pa or lower using a MBP, then the interfacial oxygen density can be lowered by 14.8 percent or more compared to when there was no $SiH_4$ purge.

Even more satisfactory results are obtained by implementing the $SiH_4$ purge at a high vacuum intensity of 10 Pa or below using a TMP. In this case, one can see that the interfacial oxygen density can be drastically lowered (at least 14.7% or more) compared to when the MBP was used.

The interfacial oxygen density can also be drastically lowered (at least 27.3% or more) compared to when there is no $SiH_4$ purge.

Moreover, performing $SiH_4$ purge at the depressurized pressure of 2.7 Pa or lower using a TMP, allows a further drastic decrease (at least 73.4% or more) in the interfacial oxygen density compared to when performing a $SiH_4$ purge at the depressurized pressure of 10 Pa or lower.

It can also be seen that the interfacial oxygen density can be drastically lowered even further (at least 80.7% or more) compared to when there was no $SiH_4$ purge.

The above experiment shows that performing an $SiH_4$ purge prior to forming the D-polysilicon film (phosphorus dope silicon film) is effective in lowering the interfacial oxygen density, and that the effect increases the lower the temperature and the higher the vacuum. It can also be seen that setting temperature between 200° C. and 430° C. and the pressure ($SiH_4$ partial pressure) between 1 Pa and 10 Pa drastically lowers the interfacial oxygen density.

The high oxygen reduction effect achieved at a low temperature (430° C. or lower) and also a high vacuum (10 Pa or lower) is attributed to the following reasons.

Namely, the binding between the oxygen atoms and the silicon atoms in the substrate surface is weak at a low temperature (430° C. or lower) so that the reduction and separating effect of hydrogen atoms on the surface is comparative large. Setting to a high vacuum (10 Pa or less) also serves to lower the $SiH_4$ partial pressure, which helps inhibit adhesion of silicon atoms to the silicon wafer surface that hinder the reducing/separating effect of the surface by the hydrogen atoms. Impurities on the wafer surface can in this way be more effectively removed.

Setting the $SiH_4$ purge temperature lower threshold to 200° C. during processing that accompanies forming a CVD film such as polysilicon film, will increase the stress on the deposited film that adhered inside the furnace when the furnace internal temperature drops too much (when set to a temperature smaller than 200° C.), so that the deposited film tends to easily separate and particles tend to generate easily.

Setting the pressure lower threshold of 1 Pa to a pressure lower than 1 Pa such as 0.1 Pa causes too large of a pressure differential between the gas supply side and exhaust side, causing variations in the oxygen removal effect to occur between the gas supply side and exhaust side. During batch processing with multiple substrates arrayed horizontally in multiple levels in the reaction furnace, the variations in the upper section and lower section of the substrate array area are especially outstanding.

If there was no $SiH_4$ purge made, then interface can be clearly identified because the crystal orientation is different at the interface. However, if an $SiH_4$ purge was made, then the crystal orientation is the same at the interface so that confirming the interface is difficult because the crystals are all oriented in the same direction.

Second Embodiment

Experiments for determining the temperature dependence of the contact resistance in $SiH_4$ purge are described next for the second embodiment.

The second embodiment evaluates the interfacial contact resistance by utilizing actual devices based on SIMS evaluation results of the first embodiment.

The SIMS results of the first embodiment showed that an $SiH_4$ purge proved effective at a low temperature and high vacuum so that the pressure here was fixed at 10 Pa using a TMP, and the temperature was set to the two cases of 330° C. and 430° C. which are lower than the film-forming temperature (530° C.).

Figure 4:
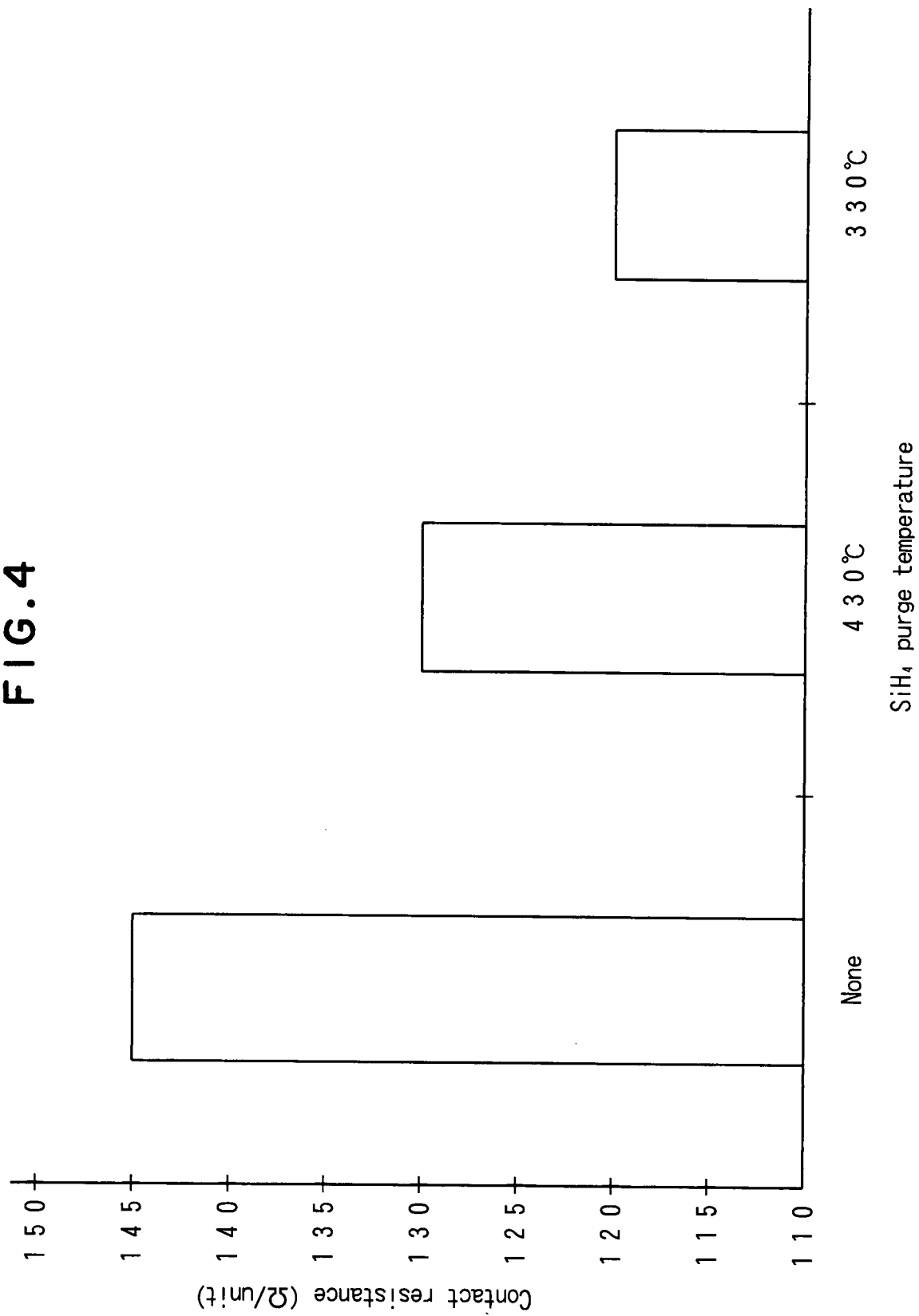
FIG. 4 is a diagram showing the $SiH_4$ purge temperature dependence of the contact resistance in the second embodiment of this invention.

FIG. 4 shows the temperature dependence of the interfacial contact resistance in the $SiH_4$ purge.

The horizontal axis indicates the $SiH_4$ purge temperature (° C.), and the vertical axis indicates the interfacial contact resistance (ohms/pieces).

In this evaluation, the $SiH_4$ purge temperature was changed to 330° C. and 430° C. as described previously.

The "None" in the figure indicated when no $SiH_4$ purge was performed.

In FIG. 4 and the same as in the SIMS evaluation results, the lower the $SiH_4$ purge temperature, the more the contact resistance was confirmed to decreased. The low-temperature and low-pressure $SiH_4$ purge was verified to be effective for electrical characteristics of the actual device.

Third Embodiment

Next in the third embodiment, an experiment performed to find the time dependence of the interfacial oxygen density in the $SiH_4$ purge in the time from setting the wafer in the furnace to starting of the $SiH_4$ purge event is described.

Figure 5:
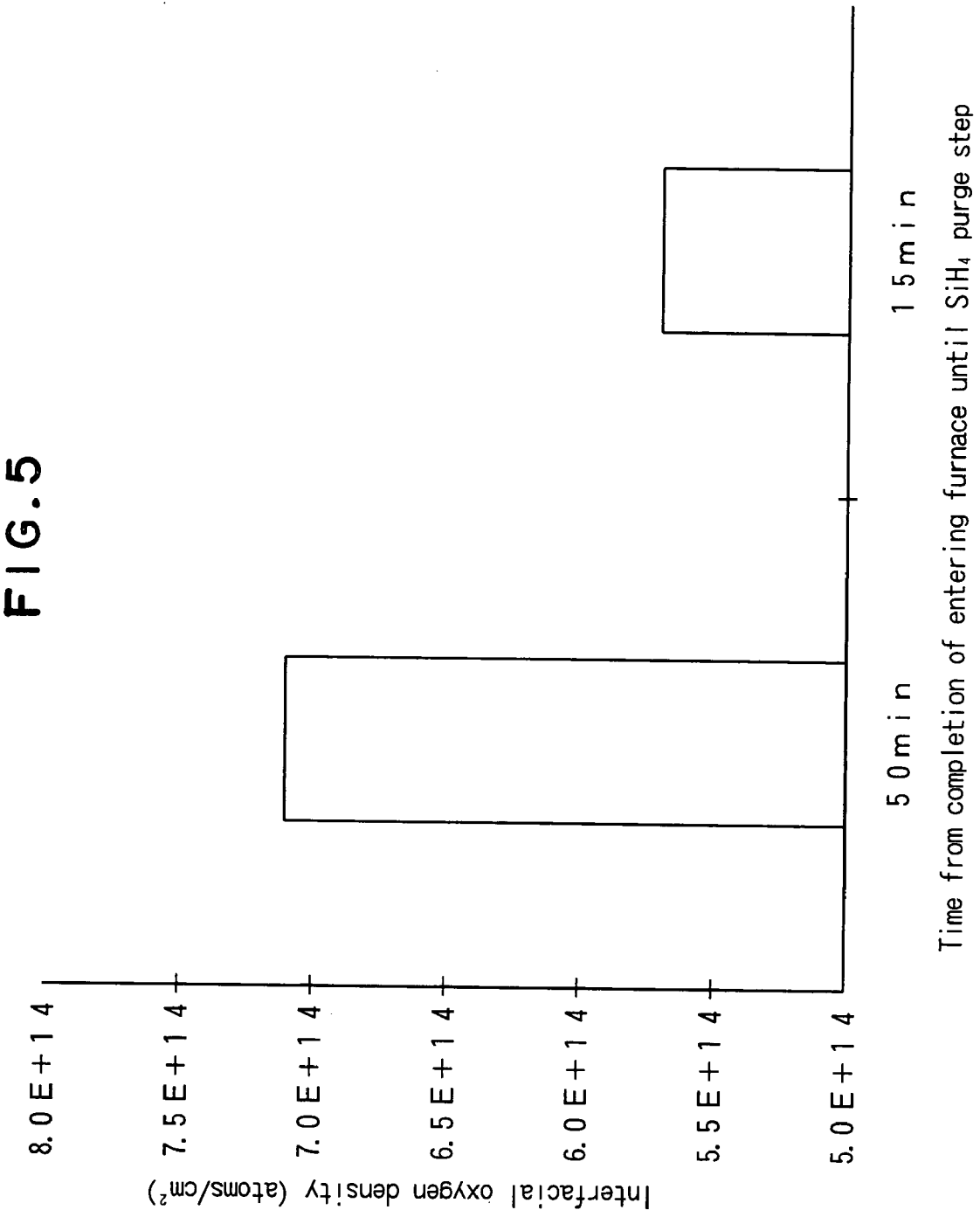
FIG. 5 is a diagram showing time dependence (SIMS results) of the interfacial oxygen density in the time from the wafer furnace inlet to the $SiH_4$ purge event in the third embodiment of this invention.

The time dependence (SIMS result) of the interfacial oxygen density in the time from the end of placing the wafer in the furnace to the $SiH_4$ purge event is shown in FIG. 5.

The horizontal axis indicates the time (minutes) from completing the placement of the wafers in the furnace to the $SiH_4$ purge event. The vertical axis indicates the interfacial oxygen density (atoms/cm²).

As shown in FIG. 5, in this evaluation the time from placing wafers in the furnace up to the SiH$_4$ purge event was changed to 50 minutes and 15 minutes.

One can see in FIG. 5, that the shorter of the times from placing wafers in the furnace up to the SiH$_4$ purge event possesses a slight interfacial oxygen density. That result is due to the following reasons.

Namely, the wafer temperature immediately after entering the furnace is lower than the furnace temperature so that moisture and oxygen tends to attach extremely easily to the wafer. The moisture and oxygen partial pressures are also high and are also a cause in accelerating the adherence of moisture and oxygen on the wafer. The temperature inside the furnace should therefore be lowered as swiftly as possible after the wafers enter the furnace, and the interior of the furnace should be purged with reducing gases such as SiH$_4$ and H$_2$ in order to reduce the interfacial oxygen density.

In evaluating this embodiment, the SiH$_4$ purge conditions were set to 430° C., and the pressure to 10 Pa when using the TMP.

Another embodiment of this invention is described next while referring to the drawings.

The substrate processing apparatus of this embodiment is made up of a batch type vertical hot wall depressurizing CVD apparatus (hereafter called CVD apparatus) for forming a CVD film on wafers in a method for manufacturing ICs.

Figure 6:
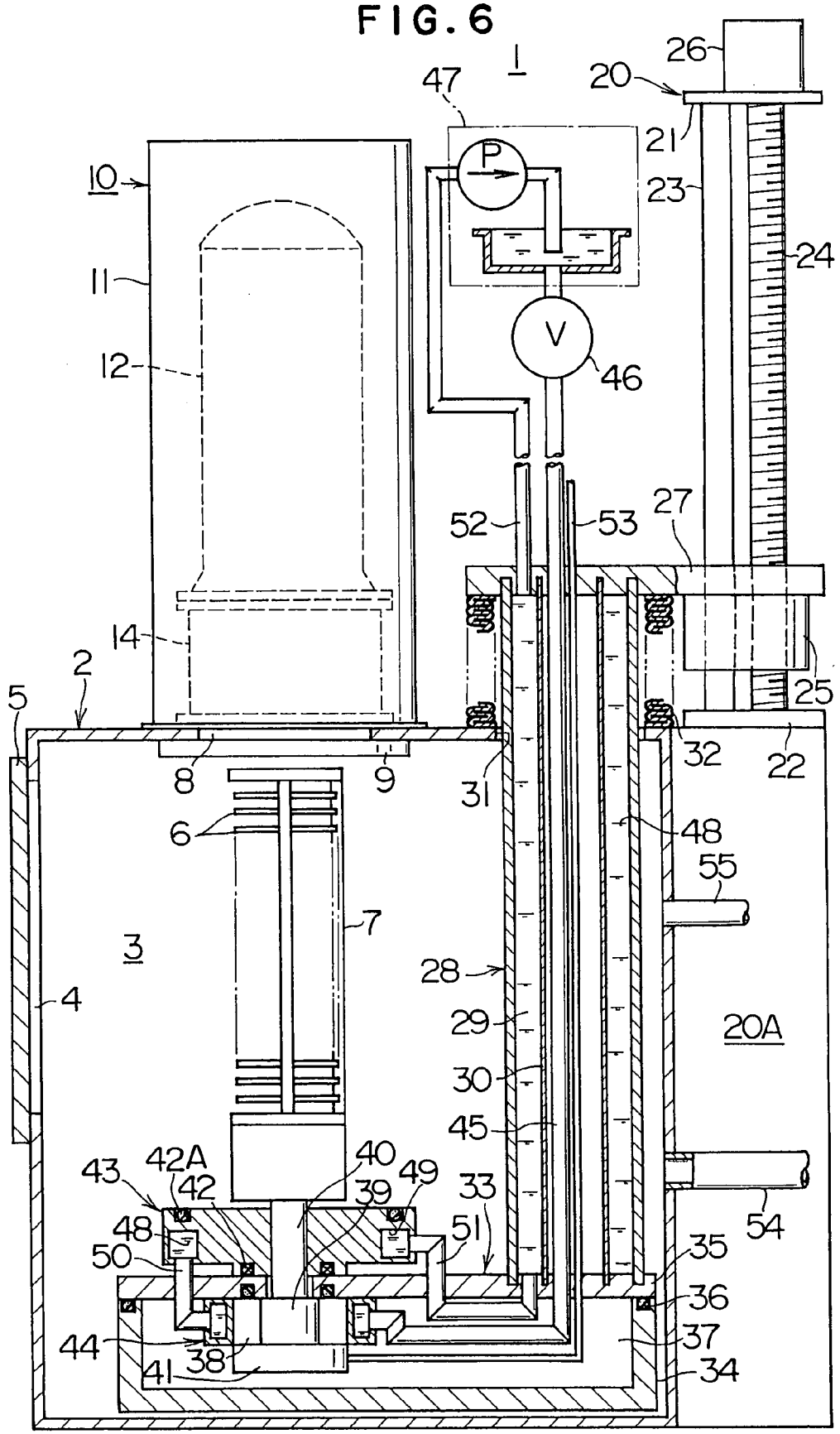
FIG. 6 is a partial cross sectional side view showing the CVD apparatus of one embodiment of this invention.

As shown in FIG. 6, the CVD device 1 includes a case 2. A standby chamber 3 is formed in the case 2 where the boat serving as the jig for substrate processing waits in standby. The standby chamber 3 is structured as a sealed chamber with airtight sealing capable of maintaining a pressure below atmospheric pressure and constitute a prechamber at a pre-stage of the reaction furnace.

A wafer loading/unloading opening 4 is formed on the front wall of the case 2. A gate 5 opens and closes the wafer loading/unloading opening 4.

A boat loading/unloading opening 8 for loading and unloading the boat 7 holding the wafers 6 is formed at a position near the wafer loading/unloading opening 4 side on the ceiling wall of the case 2. A shutter 9 opens and closes the boat loading/unloading opening 8.

Figure 7:
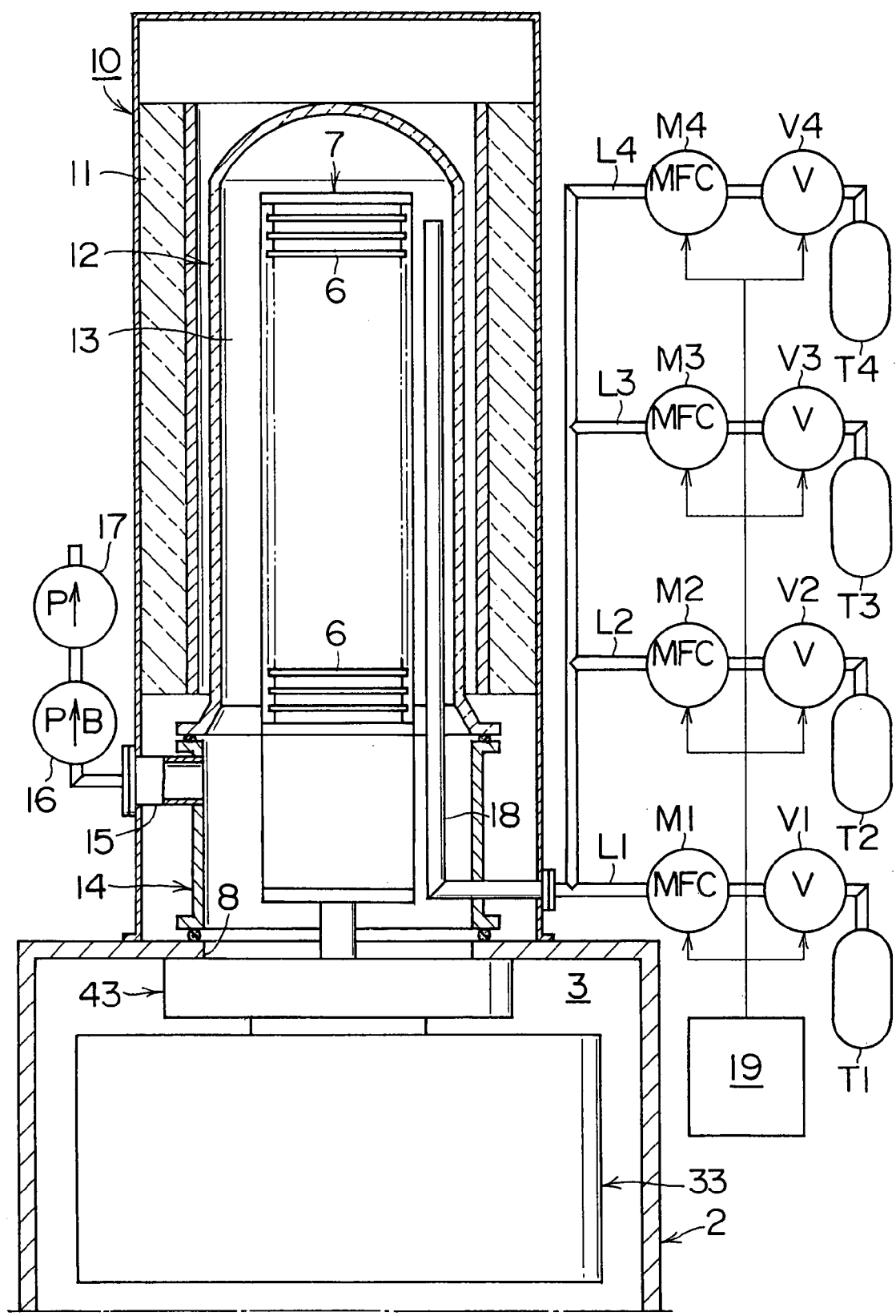
FIG. 7 is a frontal cross sectional view showing a main section of the CVD apparatus of one embodiment of this invention.

A reaction furnace 10 for processing the wafers serving as the substrate, is installed above the case 2 facing the boat loading/unloading opening 8 as shown in FIG. 7.

The reaction furnace 10 contains a heater unit 11 separated into 4 or 5 zones. A process tube 12 is mounted in the interior of the heater unit 11. The process tube 12 is formed from quartz or silicon carbide. The top end of the process tube 12 is sealed shut and the bottom end is open and formed in a cylindrical shape. The process tube 12 is installed in a shape concentric with the heater unit 11.

A processing chamber 13 is formed from the hollow cylinder section of the process tube 12.

A manifold 14 is installed below the process tube 12. The process tube 12 is installed via the manifold 14 vertically on the case 2.

One end of an exhaust line 15 for exhausting the interior of the processing chamber 13 is connected to the manifold 14. The other end of the exhaust line 15 is connected to a dry pump 17 and a mechanical booster pump 16 serving as the vacuum pump for exhausting the interior of the reaction furnace.

A nozzle 18 for supplying gas of different types to the processing chamber 13 is installed vertically on a section on a side opposite the section connecting the exhaust line 15 in the manifold 14. The bottom edge of the nozzle 18 is supported perpendicularly by clamping it to the manifold 14.

A blow vent for the nozzle 18 is formed on the top end of the nozzle 18 extending towards the wafer array. The gas blown from the blow vent of the nozzle 18 flows downward in the processing chamber 13 from the top end of the processing chamber 13.

A silicon inclusion gas supply line (hereafter called, first supply line) L1 for supplying gas containing silicon atoms into the reaction furnace 10; a chlorine inclusion gas supply line (hereafter called, second supply line) L2 for supplying gas containing chlorine atoms into the reaction furnace 10; a hydrogen gas supply line (hereafter called, third supply line) L3 for supplying hydrogen gas into the reaction furnace 10; and a nitrogen gas supply line (hereafter called, fourth supply line) L4 for supplying nitrogen gas into the reaction furnace 10; are respectively connected in parallel to the nozzle 18.

The upper flow end of the first supply line L1 connects to the silicon inclusion gas supply source T1. An open/close valve V1 and a flow rate controller (mass flow controller, hereafter called, flow controller device) M1 are installed on the first supply line L1, in order from the silicon inclusion gas supply source T1 side.

The upper flow end of the second supply line L2 connects to the chlorine inclusion gas supply source T2. An open/close valve V2 and a flow controller device M2 are installed on the second supply line L2, in order from the chlorine inclusion gas supply source T2 side.

The upper flow end of the third supply line L3 connects to the hydrogen gas supply source T3. An open/close valve V3 and a flow controller device M3 are installed on the third supply line L3, in order from the hydrogen gas supply source T3 side.

The upper flow end of the fourth supply line L4 connects to the nitrogen gas supply source T4. An open/close valve V4 and a flow controller device M4 are installed on the fourth supply line L4, in order from the nitrogen gas supply source T4 side.

The open/close valve (hereafter called, first open/close valve) V1 and the flow controller device (hereafter called, first flow controller device) M1 on the first supply line L1; the open/close valve (hereafter called, second open/close valve) V2 and the flow controller device (hereafter called, second flow controller device) M2 on the second supply line L2; the open/close valve (hereafter called, third open/close valve) V3 and the flow controller device (hereafter called, third flow controller device) M3 on the third supply line L3; and the open/close valve (hereafter called, fourth open/close valve) V4 and the flow controller device (hereafter called, fourth flow controller device) M4 on the fourth supply line L4; are electrically connected to a controller 19.

The controller 19 controls the operations to supply the pretreating gas, or in other words gas containing silicon atoms and gas containing chlorine atoms alternately into the reaction furnace 10 in order to pretreat the wafers, and to supply the processing gas into the reaction furnace 10 in order to perform the main processing on the pretreated wafers.

The controller 19 controls the operations to supply pretreating gas into the reaction furnace 10 and pretreat the wafers, and then to supply process gas into the reaction furnace 10 and perform the main process on the pretreated wafer. The controller 19 also controls the operation so that hydrogen gas is continuously supplied into the reaction furnace 10, in the period from the end of preprocessing to the start of main processing, at least when vacuum-exhausting the interior of the reaction furnace 10.

Though not shown in the drawing, the controller 19 is also electrically connected to each unit constituting the CVD apparatus 1 such as the heater unit 11, the mechanical booster pump 16, the dry-pump 17, and a boat elevator 20 and boat rotation drive motor 41 described later on. The controller 19 controls the operation of these units.

An installation mount 20A is installed outside the standby chamber 3 of the case 2 as shown in FIG. 6. The boat elevator 20 is installed on the installation mount 20A to raise and lower the boat.

The boat elevator 20 contains a feed screw shaft 24 and a guide rail 23 respectively installed vertically by an upper mount plate 21 and a lower mount plate 22. A raise/lower block 25 engages with the guide rail 23 for freely rising and lowering in a perpendicular direction. The raise/lower block 25 spirally engages with the feed screw shaft 24 to freely advance and retract vertically.

The spiral screw section where the feed screw shaft 24 engages with the raise/lower block 25, uses a ball screw mechanism for satisfactory operation and backlash.

The upper end of the feed screw shaft 24 penetrates through the upper mount plate 21. A motor 26 installed on the upper mount plate 21 drives the feed screw shaft 24 clockwise and counterclockwise.

An arm 27 is horizontally affixed to the side surface of the raise/lower block 25. A raise/lower shaft 28 formed in a tubular shape is affixed on the tip of the arm 27 facing downward and vertically.

An inner tube 30 formed in a tubular shape with an outer diameter smaller than the inner diameter of the raise/lower shaft 28 is clamped concentrically to the hollow section 29 of the raise/lower shaft 28.

The lower end of the raise/lower shaft 28 passes through an insertion hole 31 formed in the ceiling wall of the case 2, and inserts into the standby chamber 3. A bellows 32 is installed between the upper surface of the ceiling wall of the case 2 and the lower surface of the arm 27 to seal the insertion hole 31 airtight.

An elevator stand 33 for raising and lowering the boat is clamped horizontally to the bottom end of the raise/lower shaft 28 in the standby chamber 3. The elevator stand 33 contains a body 34 formed in a box shape open on the top side, and a lid piece 35 formed in a flat shape. The lid piece 35 presses on a seal ring 36 to cover the body 34 so that the elevator stand 33 forms an airtight chamber 37.

A bearing unit 39 sealed by a magnetic fluid seal device 38 is mounted on the lower surface of the lid piece 35 of the elevator stand 33 which is the ceiling surface of the airtight chamber 37. The bearing unit 39 supports a rotation shaft 40 that rotates freely while inserted vertically in the lid piece 35. The boat rotation drive motor 41 drives the rotation shaft 40.

The boat 7 is mounted erectly and perpendicular on the top edge of the rotation shaft 40.

The boat 7 horizontally holds multiple wafers 6 (for example, 25 wafers, 50 wafers, 75 wafers, 100 wafers, 200 wafers, etc.) arrayed with their centers aligned. The boat 7 is structured to be loaded/unloaded into/from the processing chamber 13 of the process tube 12 along with the rising and lowering of the elevator stand 33 by the boat elevator 20.

A seal cap 43 is mounted via a seal ring 42 on the upper surface of the elevator stand 33. The seal cap 43 is structured to seal the boat loading/unloading opening 8 of the case 2 making the furnace inlet for the processing chamber 13 via a seal ring 42A.

A cooler unit 44 is installed on the outer side of the magnetic fluid seal device 38. A cooling water supply pipe 45 connects to the cooler unit 44. The cooler unit 44 is structured to cool the magnetic fluid seal device 38 and the bearing unit 39 and the boat rotation drive motor 41.

The cooling water supply pipe 45 extends from the airtight chamber 37 via the hollow section of the inner tube 30 to outside the standby chamber 3. The cooling water supply pipe 45 connects to a cooling water supply source 47 via a variable flow regulator valve 46.

A flow path 49 is formed in the interior of the seal cap 43 for allowing the flow of the cooling water 48. The cooling water from the cooler unit 44 is supplied via an in-flow connecting pipe 50 into the flow path 49. The flow path 49 is structured to cool the seal rings 42, 42A.

One end of an out-flow connecting pipe 51 is connected to the flow path 49. The other end of the out-flow connecting pipe 51 is connected to the bottom end of the hollow section 29 of the raise/lower shaft 28. A cooling water drainage pipe 52 connects to the upper end of the hollow section 29 of the raise/lower shaft 28. The cooling water drainage pipe 52 connects to the cooling water supply source 47.

The cooling water 48 therefore flows into the hollow section 29 of the raise/lower shaft 28 from the out-flow connecting pipe 51 at the bottom end and is drained from the cooling water drainage pipe 52 at the top end.

A power feed line 53 for the boat rotation drive motor 41 is inserted through the hollow section of the inner tube 30 and extends outside.

On the other hand as shown in FIG. 6, one end of an exhaust line 54 for exhausting the atmosphere within the standby chamber 3 is connected to the case 2, and the other end of the exhaust line 54 is connected to the exhaust device (not shown in drawing).

One end of a nitrogen gas supply line 55 for supplying nitrogen gas as the purge gas into the standby chamber 3 is connected to the case 2, and the other end of the nitrogen gas supply line 55 is connected to the nitrogen gas supply source (not shown in drawing).

The film-forming process in the IC manufacturing method of one embodiment of the present invention when forming a polysilicon film on wafers using the CVD apparatus structured as related above is described next using the process flow shown in FIG. 8.

In the following description, the controller 19 controls the operation of each unit in the CVD apparatus 1.

Figure 8:
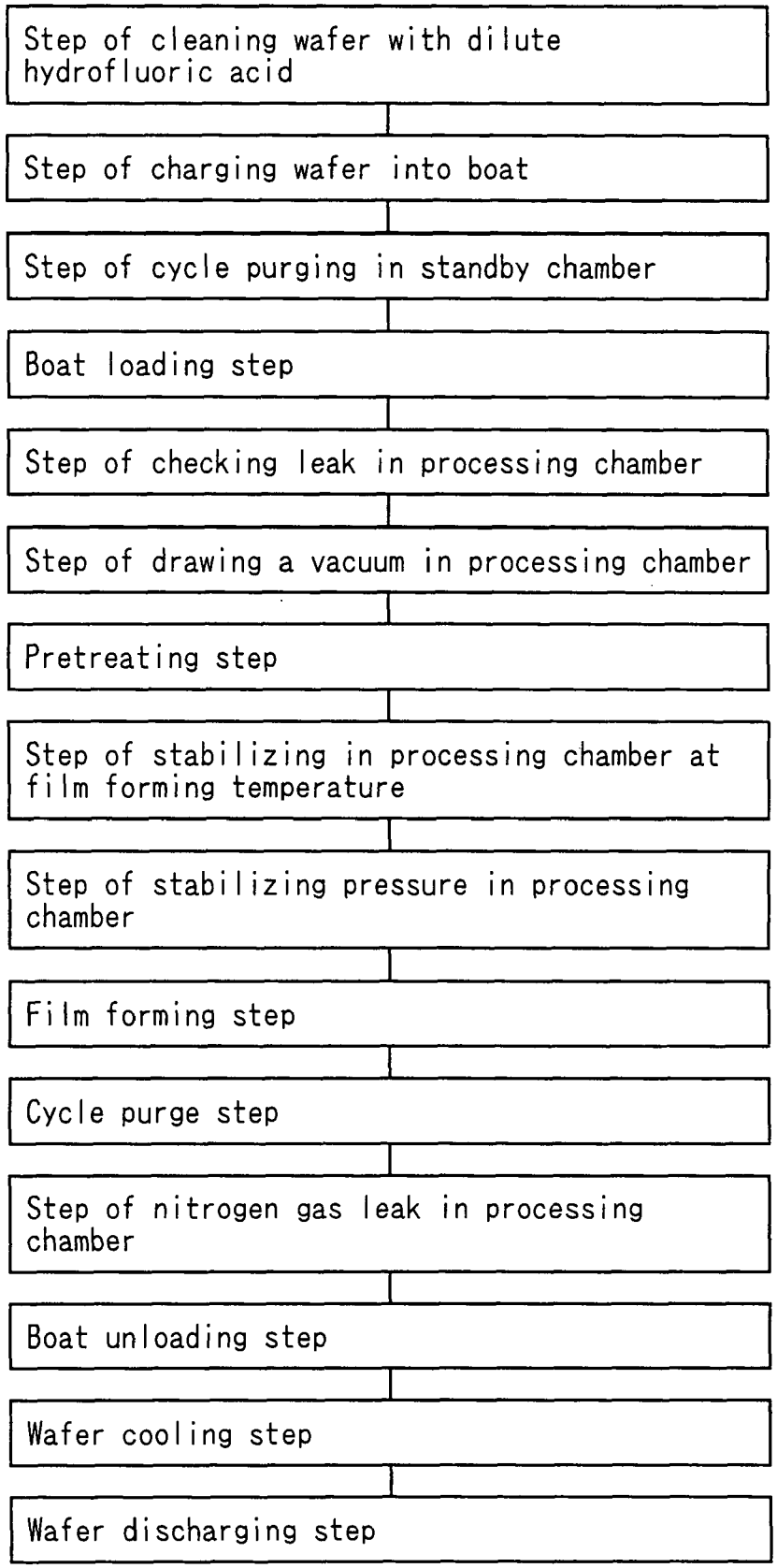
FIG. 8 is a process flow chart showing the film forming process of the IC manufacturing method of one embodiment of this invention.

In the dilute hydrofluoric acid cleaning step shown in FIG. 8, the natural oxidation film is removed in advance from the surface of wafers for film-forming by dilute hydrofluoric acid (HF), and the surface is hydrogen-terminated.

The wafers from whose surface the natural oxidation film was removed in advance and hydrogen terminated, are conveyed by the in-process transfer device to the CVD apparatus 1 for film-forming.

In the step of charging the wafers into the boat shown in FIG. 8, the wafers 6 for film-forming are carried via the wafer loading/unloading opening 4 of the case 2, into the standby chamber 3 by the wafer transfer device (not shown in drawing) and charged into the boat 7.

In this case, the shutter 9 seals the boat loading/unloading opening 8 as shown in FIG. 6 so that the high temperature atmosphere in the processing chamber 13 is prevented from flowing into the standby chamber 3. The wafers 6 that are charged and the wafers being charged are therefore not exposed to the high temperature atmosphere, so that harmful effects occurring on the wafers 6 due to natural oxidation in a high temperature atmosphere are prevented.

When a pre-specified number of wafers 6 are charged into the boat 7, the gate 5 seals the wafer loading/unloading opening 4 as shown in FIG. 6.

Next, in the standby chamber cycle purge step, the exhaust line 54 draws a vacuum inside the standby chamber 3. The drawing of a vacuum and the nitrogen gas purge in the standby chamber 3 are repeatedly performed by supplying nitrogen gas into the standby chamber 3 from the nitrogen gas supply line 55.

The cycle of the drawing of a vacuum and the nitrogen gas purge in this standby chamber cycle purge step, removes the moisture and oxygen from the atmosphere within the standby chamber 3.

After then adjusting the pressure within the standby chamber 3 to the same level as the pressure in the processing chamber 13, the shutter 9 opens the boat loading/unloading opening 8.

Next, in the boat loading step, the boat 7 supported on the elevator stand 33 via the seal cap 43, is raised by the motor 26 of the boat elevator 20 via the raise/lower block 25 and the raise/lower shaft 28, and loaded from the boat loading/unloading opening 8 into the processing chamber 13 of the process tube 12 (boat loading).

The temperature within the processing chamber 13 is regulated within a specified temperature range between 100 to 400° C. for example such as 200° C. in order to prevent surface oxidation of the wafers 6 on the boat 7 during the boat loading.

When the boat 7 reaches the upper limit, the circumference of the upper surface of the seal cap 43 sets the boat loading/unloading opening 8 to a sealed state via the seal ring 42A so that the processing chamber 13 of the process tube 12 is sealed airtight.

The bellows 32 elongates upward, when the raise/lower shaft 28 rises during loading of the boat 7 into the processing chamber 13.

Next, in the leak check step within the processing chamber as shown in FIG. 8, a leak check is made in the processing chamber 13.

Then in the vacuum drawing step in the processing chamber shown in FIG. 8, the mechanical booster pump 16 and the dry pump 17 exhaust the interior of the processing chamber 13 to vacuum of a pressure for example of about 1 Pa via the exhaust line 15.

The third open/close valve V3 is then opened, and the hydrogen gas as a carrier gas is supplied into the processing chamber 13 exhausted to the vacuum from the hydrogen gas supply source T3 via the third supply line L3, the third flow controller device M3 and third open/close valve V3, and a hydrogen gas purge is implemented in the processing chamber 13.

Nitrogen gas may also be used as the carrier gas.

The pressure within the processing chamber 13 is regulated in this way at a specified pressure within a range of 30 to 10,000 Pa for example of 45 Pa as a pressure higher than the pressure in the film-forming (main process) step which is lower than atmospheric pressure.

The boat rotation drive motor 41 rotates the boat 7 at a specified rotation speed.

Then, in the pretreating step shown in FIG. 8, while maintaining a supply of hydrogen gas to the processing chamber 13 exhausted to the vacuum, gas containing silicon atoms or gas containing chlorine atoms such as a silane type gas, silane type gas containing halogen, or hydrochloric gas is supplied into the processing chamber 13.

The gas can be supplied into the processing chamber 13 via the first supply line L1 through the fourth supply line L4 by the controller 19 regulating the flow via the first open/close valve V1 through the fourth open/close valve V4 as well as the first flow controller device M1 through the fourth flow controller device M4.

The pretreating step sequence is described in detail later while referring to FIG. 4 through FIG. 7.

When the pretreating ends, in the stabilizing step inside the processing chamber 13 at the film-forming temperature, the temperature within the processing chamber 13 is adjusted to rise from the pretreating temperature to a film-forming temperature, up to 620° C. for example when forming polysilicon film.

At this time hydrogen gas as a carrier gas continuously flows into the processing chamber 13 exhausted to the vacuum via the exhaust line 15, so that along with removing residual gas within the processing chamber 13, contamination due to reverse diffusion from the exhaust line 15 is also prevented.

In the pressure stabilizing step inside the processing chamber, when the temperature inside the processing chamber 13 rises and stabilizes at the film-forming temperature, the mechanical booster pump 16 and the dry pump 17 exhaust the interior of the processing chamber 13 via the exhaust line 15, to adjust the pressure inside the processing chamber 13 to a specified processing pressure for example of about 20 Pa.

Hydrogen gas is continuously supplied at this time into the processing chamber 13 exhausted to the vacuum, to prevent contamination due to reverse diffusion from the exhaust line 15.

The step of stabilizing the interior of the processing chamber at the film-forming temperature, and the step of stabilizing the processing chamber internal pressure may be performed simultaneously.

Next, in the film-forming (deposition) step serving as the main process step, the first open/close valve V1 is opened and monosilane gas for example is supplied into the processing chamber 13 as the material gas from the silicon inclusion gas supply source T1 via the first supply line L1, the first open/close valve V1 and the first flow controller M1. The third open/close valve V3 is closed at this time to stop the supply of hydrogen gas to the processing chamber 13.

A polysilicon film that satisfies the pre-established processing conditions is in this way formed on the wafers 6.

The boat rotation drive motor 41 at this time rotates the boat 7 and the material gas makes uniform contact with the surface of the wafers 6 so that a polysilicon film is formed uniformly on the wafers 6.

The cooling water 48 flows through the flow path 49 of the cooler unit 44 and seal cap 43 via the cooling water supply pipe 45 and the cooling water drainage pipe 52, to prevent deterioration of the seal rings 42, 42A of the seal cap 43, the magnetic fluid seal device 38 and the bearing unit 39 due to heat. The cooling water 48 at this time flows through the hollow section 29 of the raise/lower shaft 28 to cool the raise/lower shaft 28 and the inner tube 30.

The closing of the first open/close valve V1 after a pre-specified processing time elapses, stops the flow of material gas into the processing chamber 13. Also, in the cycle purge step, the fourth open/close valve V4 is opened, and the interior of the processing chamber 13 and the interior of the nozzle 18 are cycle-purged with nitrogen gas.

Next, during the nitrogen gas leak step in the processing chamber, the interior of the processing chamber 13 is returned to atmospheric pressure by using nitrogen gas.

Next, in the boat unloading step, the elevator stand 33 supporting the seal cap 43 and the boat 7, is lowered by the motor 26 of the boat elevator 20 via the raise/lower shaft 28 and the raise/lower block 25 so that the boat 7 holding the processed wafers 6 is unloaded to the standby chamber 3 (boat unloading).

The bellows 32 contracts downward at this time as the raise/lower shaft 28 moves downward.

The shutter 9 seals the boat loading/unloading opening 8 when the boat 7 is unloaded from the processing chamber 13 to the standby chamber 3.

Nitrogen gas is supplied from the nitrogen gas supply line 55 into the standby chamber 3 while exhausting the interior of the standby chamber 3 via the exhaust line 54. The flow of nitrogen gas into the standby chamber 3 forces the processed wafers 6 to cool (wafer cooling step).

Afterwards, in the wafer discharge step, the gate 5 opens the wafer loading/unloading opening 4 of the standby chamber 3, and the processed wafers 6 held in the boat 7 are discharged by the wafer transfer device.

Preventing thermal expansion of the raise/lower shaft 28 at this time avoids deviation in the reference height of the boat 7 so that the wafer transfer device correctly and speedily removes the processed wafers 6 from the boat 7.

Multiple (for example, 25 wafers, 50 wafers, 75 wafers, 100 wafers, 200 wafers, etc.) wafers 6 are from hereon processed at a time in batches by the CVD apparatus 1 by repeating the above operation.

The processing sequence including the pretreating step in the film-forming process of the IC manufacturing method in one embodiment of the present invention is next described in detail using the timing charts (time-based drawings) shown respectively in FIG. 9 through FIG. 12.

The pretreating step using monosilane gas is executed according to the pretreating conditions (between 200° C. and 430° C., and between 1 Pa to 10 Pa) found in the first embodiment.

FIG. 9 through FIG. 12 respectively show the process sequences including the pretreating step of the second embodiment through fifth embodiment.

FIG. 9 through FIG. 12 are time charts that respectively show temperature changes within the processing chamber, the process sequence, the supply timing for each gas and changes in the internal processing chamber pressure during forming of the polysilicon film on the wafer in the reaction chamber.

Figure 9:
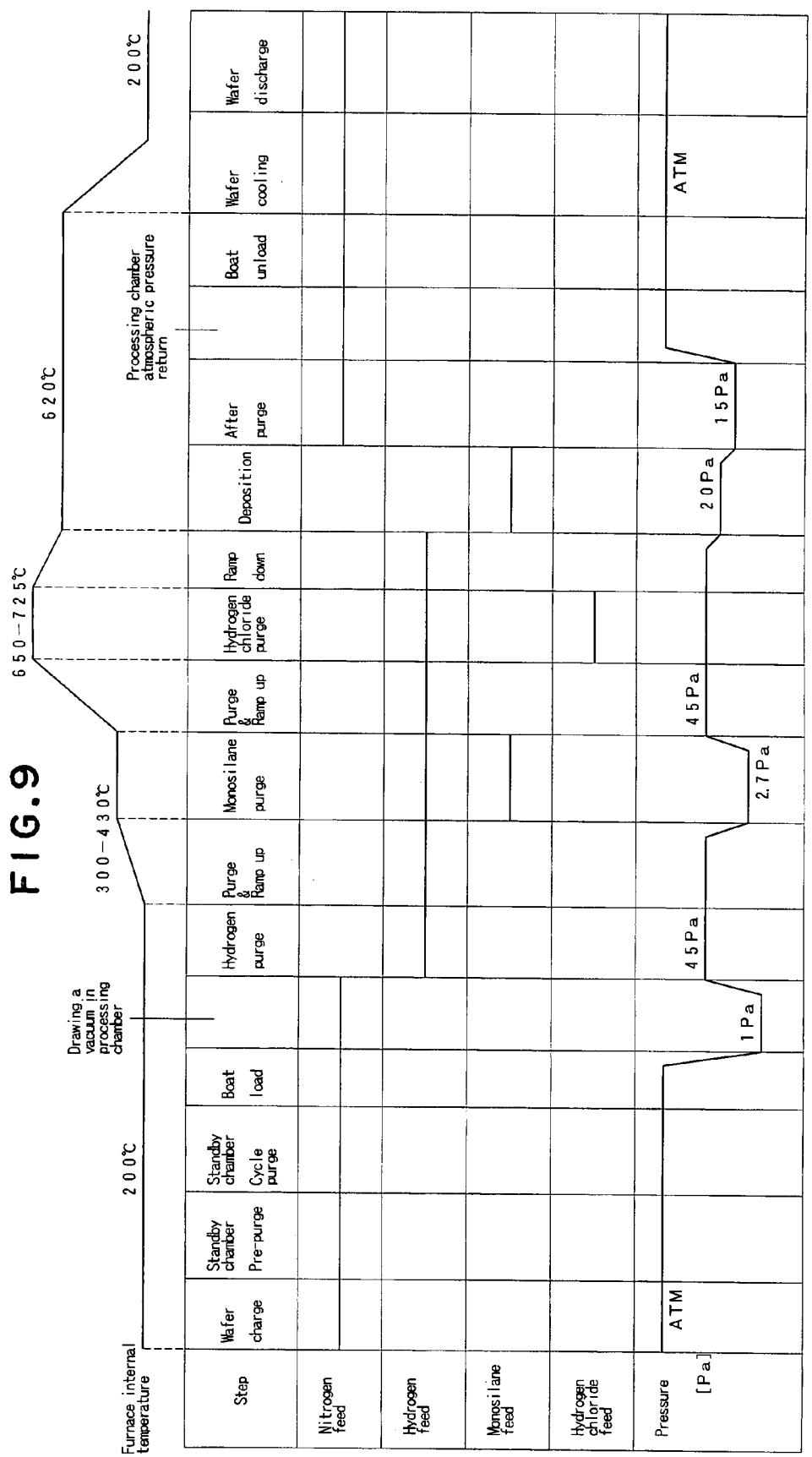
FIG. 9 is a timing chart showing the second embodiment of the process sequence including the pretreating step.

In the second embodiment of the process sequence including the pretreating step shown in FIG. 9, the pressure in the processing chamber 13 is set to specified pressure for example of 45 Pa after the boat loading step, and then the temperature within the processing chamber 13 serving as the internal furnace temperature, is raised from the temperature during boat loading (wafer carry-in temperature) for example of 200° C., to the first temperature during supplying gas containing silicon atoms to inside the reaction furnace, for example of 300 to 430° C. (purge and ramp-up).

When raising the temperature to this first temperature, the supply of hydrogen gas starts to the processing chamber 13 exhausted to a vacuum. In this embodiment, the supply of hydrogen gas (hydrogen purge) into the processing chamber 13 starts prior to starting to raise the temperature up to the first temperature.

Hydrogen gas is continuously supplied into the processing chamber 13 until the start of the main process step (deposition).

After the temperature within the processing chamber 13 reaches the first temperature, gas containing silicon atoms is supplied to the processing chamber 13 while maintaining the supply of hydrogen gas to the processing chamber 13.

In this embodiment, silane type gas, namely monosilane gas is utilized as the gas containing silicon atoms (monosilane purge). The first temperature is between 200° C. and 430° C. and preferably is a specified temperature (for example 300° C.) in a range between 300° C. and 430° C.

This first temperature is needed because if the temperature within the processing chamber 13 drops too far during forming of the polysilicon film, such as to a temperature smaller than 200° C. or for example 100° C., then the deposited film tends to easily peel due to the increased stress on the deposited film adhering within the processing chamber 13 and particles tend to easily be generated.

On the other hand, when pretreating is performed at a temperature higher than 430° C., then the adhesion effect of Si—H bonded silane molecules to the silicon wafer surface is stronger than reduction-elimination effect of H atoms on the surface, so that the natural oxidation film or impurities on the wafer cannot be adequately removed.

As shown in FIG. 9, hydrogen gas is continuously supplied, even while the monosilane gas is being supplied (during monosilane gas purge).

When monosilane gas is being supplied, the pressure inside the processing chamber 13 drops to the first pressure, for example a specified pressure in a range between 1 Pa and 10 Pa (such as 2.7 Pa) and is held there.

Maintaining the supply of the monosilane gas and the hydrogen gas to the processing chamber 13 for the specified time while being held at this temperature and pressure, allows performing a process for removing the natural oxidation film and contaminant substances from the wafer in a specified time. In other words, a first cleaning step is performed using silicon atoms (Si) as the main element.

The reaction mechanism when performing the first cleaning step using monosilane gas is described next. Namely, supplying monosilane gas to the processing chamber 13 maintained at the above described pressure and temperature mainly causes the following reaction.

$$SiH_4 \rightarrow SiH_2 + H_2 \quad (1)$$

$$SiH_4 \rightarrow SiH_3 + H^* \quad (2)$$

$$\downarrow$$

$$SiH_2 + H_2O\uparrow \rightarrow SiO\uparrow + 2H_2 \quad (3)$$

$$2SiH_2 + O_2 \rightarrow 2SiO\uparrow + 2H_2 \quad (4)$$

$$2H^* + O \rightarrow H_2O\uparrow \quad (5)$$

$$SiH_4 + SiO_2 \rightarrow 2SiO\uparrow + 2H_2 \quad (6)$$

The monosilane gas first of all, does not completely break down in comparatively low temperature regions of 300 to 430° C., and separates into a predicted $SiH_2$ and $H_2$ state and a $SiH_3$ and $H^*$ state {reaction formulas (1) and (2)}.

By reacting with moisture and oxygen adhering to the wafer surface or remaining in the atmosphere within the processing chamber 13, these substances are vaporized and removed in their respective SiO state and $H_2O$ state {reaction formulas (3) (4) (5)}.

A slight reaction such as in reaction formula (6) occurs because of the comparatively low temperature so that the natural oxidation film ($SiO_2$) formed on the wafer surface is removed to a slight extent. Carbon that also adhered to the surface of the $SiO_2$ film can also be removed at this time.

As shown in FIG. 9, the first cleaning step using silicon atoms as the main element ends, when the supply of monosilane gas is stopped.

After the first cleaning step using silicon (Si) atoms as the main element has ended, the temperature inside the furnace is raised from the first temperature to the second temperature different from the first temperature as shown in FIG. 9 (purge and ramp-up).

As shown in FIG. 9, hydrogen gas is continuously supplied into the processing chamber 13 exhausted to a vacuum, even when the temperature is rising from the first temperature to the second temperature.

The pressure inside the processing chamber 13 at this time, is raised from the first pressure, up to a second pressure different from the first pressure.

This second temperature is the temperature utilized in the second cleaning step that supplies gas containing chlorine atoms into the reaction chamber.

In the present embodiment, gas containing chlorine atoms is utilized as the hydrogen chloride gas.

The second temperature is preferably a specified temperature within a range from 650° C. to 725° C.

As shown in FIG. 9, hydrogen gas is continuously supplied into the processing chamber 13 even when the hydrogen chloride gas is being supplied (during hydrogen chloride gas purge).

The pressure inside the processing chamber 13 is maintained at a second pressure (for example 45 Pa) during supply of hydrogen chloride gas.

The process of removing contaminant substances from the wafer is performed in the specified time by maintaining the supply of hydrogen chloride gas and hydrogen gas for the specified time into the processing chamber 13 being held at this temperature and pressure. In other words, a second cleaning step using chlorine (Cl) atoms as the main element is performed.

The reaction mechanism when performing the second cleaning step using hydrogen chloride gas is described next. Namely, supplying hydrogen chloride gas into the processing chamber 13 maintained at the above described pressure and temperature, mainly causes the following reaction.

$$HCl \rightarrow 2H_2 + 2Cl_2 \tag{7}$$

$$2H_2 + C \rightarrow CH_4 \uparrow \tag{8}$$

$$2H_2 + O_2 \rightarrow 2H_2O \uparrow \tag{9}$$

$$2Cl_2 + Si \rightarrow SiCl_4 \uparrow \tag{10}$$

The HCl is broken down into $H_2$ and $Cl_2$ {reaction formula (7)} and the $H_2$ occurring from this breakdown process reacts with residual carbon in the atmosphere within the processing chamber 13 and carbon adhering to the wafer surface, to be vaporized in the $CH_4$ state and removed {reaction formula (8)}.

Moreover, the hydrogen ($H_2$) from the breakdown process reacts with the residual oxygen in the atmosphere within the processing chamber 13 and oxygen adhering to the wafer surface, to be vaporized in the $H_2O$ state and removed {reaction formula (9)}.

The chlorine ($Cl_2$) from the breakdown process removes a slight amount of the silicon surface, and the carbon and $SiO_2$ adhering to the silicon surface are removed at this time {reaction formula (10)}.

Alternately (separately) supplying monosilane gas and hydrogen chloride gas at different temperature ranges, renders a larger effect in removing the oxygen and carbon.

Hydrogen gas is continuously supplied and cleaning with hydrogen gas is performed during the first cleaning step and second cleaning step.

The reaction mechanism of the cleaning with hydrogen gas is described next. Namely, the following reaction is mainly caused in the processing chamber 13.

$$SiO_2 + H^* \rightarrow SiO \uparrow + OH \uparrow \tag{11}$$

$$SiO_2 + H_2 \rightarrow SiO \uparrow + H_2O \uparrow \tag{12}$$

$$C + 2H_2 \rightarrow CH_4 \uparrow \tag{13}$$

$$O + H^* \rightarrow OH \uparrow \tag{14}$$

The hydrogen ($H_2$) reacts with the residual oxygen and carbon in the atmosphere within the reaction furnace, to be vaporized in the respective $CH_4$ and OH states and removed {reaction formula (13) (14)}.

The mechanism occurring in (11) and (12) removes the natural oxidation film in the SiO and OH and $H_2O$ states.

After the second cleaning step ends, as shown in FIG. 9, the temperature within the furnace lowers (ramp down) from the second temperature to a third temperature different from the second temperature; and the pressure inside the processing chamber 13 lowers from the second pressure to a third pressure different from the second pressure.

Hydrogen gas is continuously supplied into the processing chamber 13 exhausted to a vacuum, even when the pressure and temperature have changed from the second temperature and pressure to the third temperature and pressure.

This third temperature and pressure are the temperature and pressure when performing the main process or in other words, the film-forming (deposition) step.

Figure 10:
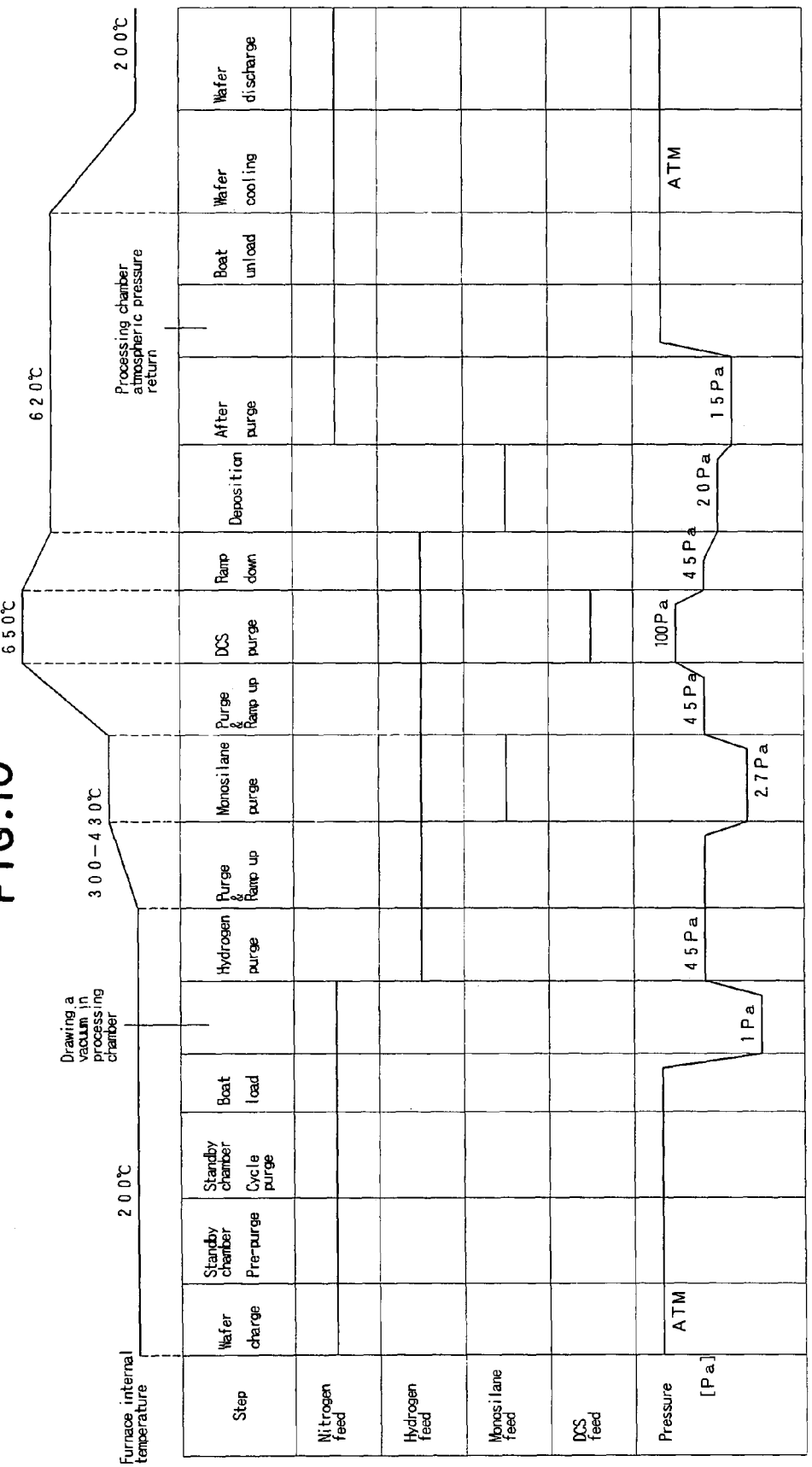
FIG. 10 is a timing chart showing the third embodiment of the process sequence including the pretreating step.

FIG. 10 shows the third embodiment in the processing sequence including the pretreating step.

The point where the third embodiment differs from the second embodiment is that the second cleaning step utilized dichlorosilane gas (hereafter called DCS gas) instead of hydrogen chloride gas as the gas containing chlorine atoms.

In this case, the second pressure is preferably approximately 100 Pa and the second temperature is approximately 650° C.

As shown in FIG. 10, hydrogen gas is continuously supplied into the processing chamber 13 even when dichlorosilane gas is being supplied (during DCS purge). Supplying the dichlorosilane gas and hydrogen gas into the processing chamber 13 for the specified time at this temperature and pressure, allows performing the process for removing the contaminant substances from the wafer in a specified time.

The reaction mechanism that occurs when utilizing dichlorosilane gas in the second cleaning step is described next. Namely, supplying dichlorosilane gas into the processing chamber 13 maintained at the above described pressure and temperature, mainly causes the following reaction.

$$SiH_2Cl_2 \rightarrow SiH_2 + Cl_2 \tag{15}$$

$$SiH_2 + H_2O \uparrow \rightarrow SiO \uparrow + 2H_2 \tag{16}$$

$$2SiH_2 + O_2 \rightarrow 2SiO \uparrow + 2H_2 \tag{17}$$

$$2Cl_2 + Si \rightarrow SiCl_4 \uparrow \tag{18}$$

The $SiH_2Cl_2$ is broken down into $SiH_2$ and $Cl_2$, {reaction formula (15)} and the $SiH_2$ occurring from this breakdown reacts with residual $H_2O$ and $O_2$ in the atmosphere within the processing chamber 13 and $H_2O$ and $O_2$ that has attached to the wafer surface, to be vaporized in the SiO and $H_2$ states and removed {reaction formula (16) (17)}.

The Cl$_2$ from the breakdown process removes a slight amount of the silicon surface, and the carbon and SiO$_2$ adhering to the silicon surface are removed at this same time {reaction formula (18)}.

Alternately (or separately) supplying monosilane gas and dichlorosilane gas at different temperature ranges, renders a larger effect in removing the oxygen and carbon.

In the third embodiment, hydrogen gas is continuously supplied in the first cleaning step and the second cleaning step, and cleaning with hydrogen gas is performed, the same as in the second embodiment.

The second embodiment and the third embodiment render the following effects.

1) In the pretreating step, alternately supplying gas containing silicon atoms, and gas containing chlorine atoms into the reaction furnace, allows the cleaning step mainly using silicon atoms to be performed separately (in two stages) from the cleaning step mainly using chlorine atoms, so that the oxygen atoms and carbon atoms are removed more efficiently.

2) In the pretreating step, setting the temperature inside the reaction furnace to a first temperature when supplying gas containing silicon atoms to the interior of the reaction furnace; and setting the temperature inside the reaction furnace to a second temperature different from the first temperature when supplying gas containing chlorine atoms into the interior of the reaction furnace, renders the effect that contaminant substances such as oxygen atoms and carbon atoms are removed with greater efficiency since a temperature that causes a potent cleaning effect can be set for each gas.

3) Setting the second temperature for executing the second cleaning with gas containing chlorine atoms, to a temperature different from the third temperature which is the processing temperature in the film-forming (deposition) step serving as the main process step, causes effective cleaning in the second cleaning to render the effect that contaminant substances such as O and C are removed with greater efficiency.

4) In the pretreating step, continuously supplying hydrogen gas into the reaction furnace when changing the temperature inside the reaction furnace from the first temperature to the second temperature, renders the effect that contaminant substances removed by gas containing silicon atoms can be prevented from, resettling on the wafer surface, and re-contaminating the wafer surface due to the exhaust system when changing the temperature inside the reaction furnace from the first temperature to the second temperature.

5) In the pretreating step, continuously supplying hydrogen gas into the reaction furnace when changing the temperature inside the reaction furnace from the first temperature to the second temperature, and when changing the temperature inside the reaction furnace from the second temperature to the third temperature, renders the effect that contaminant substances removed by gas containing silicon atoms can be prevented, resettling on the wafer surface, and re-contaminating the wafer surface due to the exhaust system when changing the temperature inside the reaction furnace from the first temperature to the second temperature.

Also, contaminant substances such as O and C removed by pretreating using gas containing silicon atoms and gas containing chlorine atoms can be prevented from, resettling on the wafer surface, and re-contaminating the wafer surface due to exhaust system when changing the temperature inside the reaction furnace from the second temperature to the third temperature.

6) By continuously supplying hydrogen gas into the reaction furnace in the period from the end of pretreating step to the start of the main process step (film-forming step) at least while a vacuum is drawn in the reaction furnace, the contaminant substances removed in the pretreating can be prevented from, resettling on the wafer surface, and re-contaminating the wafer surface due to exhaust system when a vacuum is drawn in the reaction furnace in the period from the end of pretreating to the start of the main process.

The gas containing silicon atoms used in the first cleaning step is preferably at least one gas selected from a group including for example monosilane gas (SiH$_4$) and disilane gas (Si$_2$H$_6$).

The gas containing chlorine atoms used in the second cleaning step is preferably at least one gas selected from a group including for example hydrogen chloride gas (HCl) and dichlorosilane gas (SiH$_2$Cl$_2$).

The first temperature in the first cleaning step and the second temperature in the second cleaning step are in different temperature ranges so that the gases can be used in various combinations, rendering a more potent effect in removing natural oxidation film and impurities.

Figure 11:
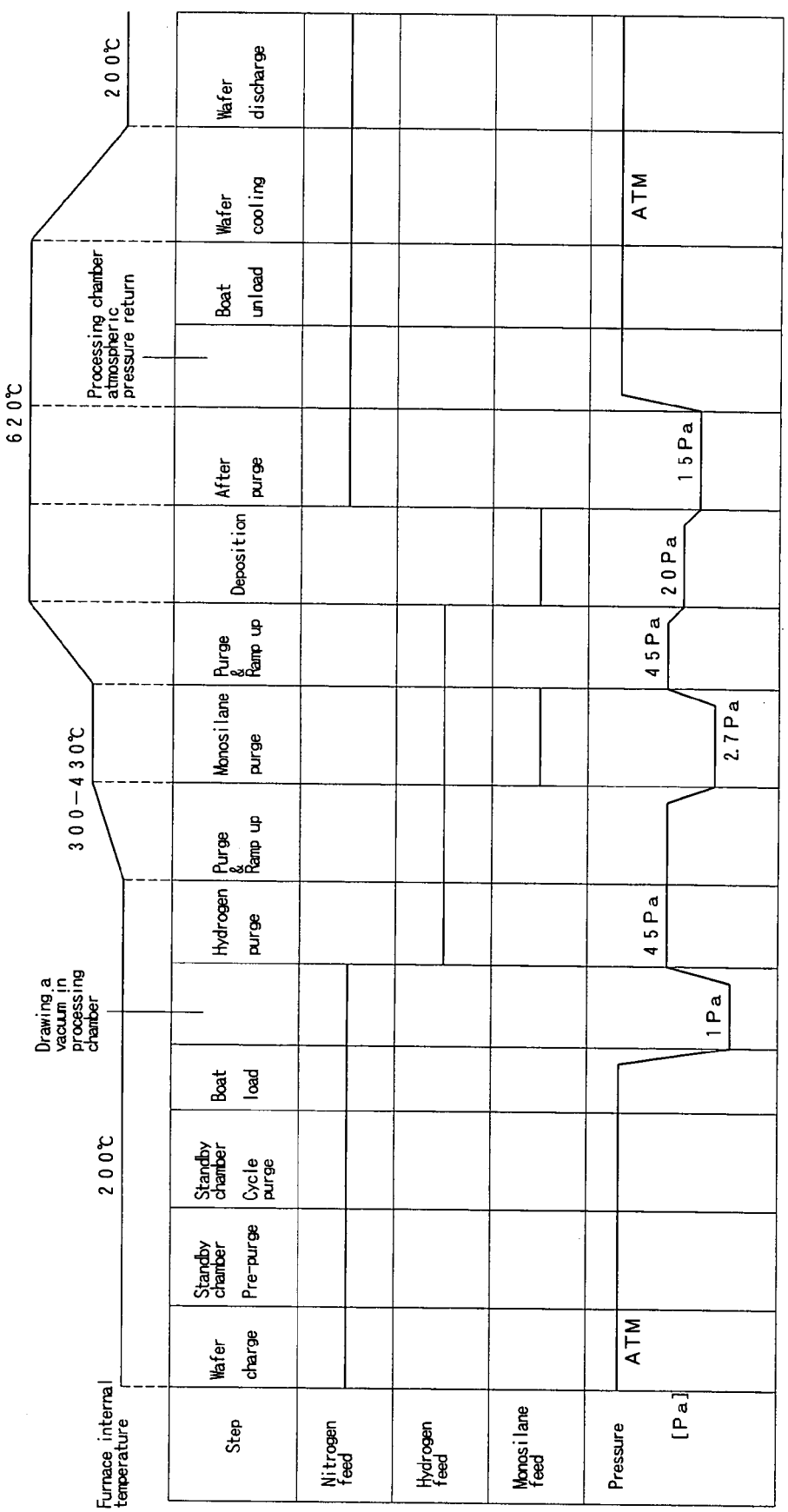
FIG. 11 is a timing chart showing the fourth embodiment of the process sequence including the pretreating step.

FIG. 11 shows the fourth embodiment of the process sequence including the pretreating step.

This fourth embodiment differs from the second embodiment in the point that there is no second cleaning step, and only the first cleaning step is performed. In other words, the step of cleaning mainly with gas containing chlorine atoms is omitted, and only the step of cleaning mainly with gas containing silicon atoms is performed.

In this embodiment also, hydrogen gas is continuously supplied into the processing chamber 13 in the period from the end of the pretreating step to the start of the film-forming (deposition) step serving as the main process step, while a vacuum is drawn in the processing chamber 13.

After the boat loading step, when raising the temperature in the processing chamber 13 up to the pretreating temperature after the vacuum drawing step has ended, the O and C adhering to the low temperature section of the reaction furnace might separate (eliminated gas), and reattach to the wafer to possibly contaminate the wafer surface.

Also, setting the processing chamber 13 to a vacuum might contaminate the wafer surface due to reverse diffusion from the exhaust line.

A vacuum is then drawn in the processing chamber 13 after loading the boat 7 into the processing chamber 13 (boat loading), and hydrogen gas is promptly supplied into the processing chamber 13 exhausted to a vacuum, at the time that the pressure in the processing chamber 13 reaches for example a specified pressure within 1330 Pa prior to starting to raise the temperature to the first temperature (pretreating temperature).

After having completely replaced with the hydrogen gas in the processing chamber 13, a vacuum is drawn in the processing chamber 13 while continuously supplying hydrogen gas into the processing chamber 13, and the pretreating step is performed after raising to the first temperature of the pretreating step.

By completely setting the interior of the processing chamber 13 to a hydrogen gas reduction atmosphere and raising the temperature while purging with the hydrogen gas, the eliminated O and C are trapped and can be removed without adhering to the wafer.

The residual and attached O and C on the wafer can also be removed, so that an even greater pretreating effect is obtained.

In this embodiment, monosilane gas is utilized as the silane type gas for performing the pretreating step.

The temperature inside the processing chamber 13 is set to a first temperature, for example a specified temperature within a range from 300 to 430° C. when performing the pretreating step with the monosilane gas. The temperature inside the processing chamber 13 is raised to a temperature of 620° C. as a second temperature different from the first temperature when performing the film-forming step serving as the main processing.

In this embodiment, hydrogen gas is continuously supplied into the processing chamber 13 in the step of raising the temperature from the first temperature to the second temperature, and therefore the O and C removed by the monosilane gas as gas containing silicon atoms can be prevented from, resettling on the wafer surface, and re-contaminating the wafer surface due to exhaust system when changing the temperature inside the processing chamber 13 from the first temperature to the second temperature.

Figure 12:
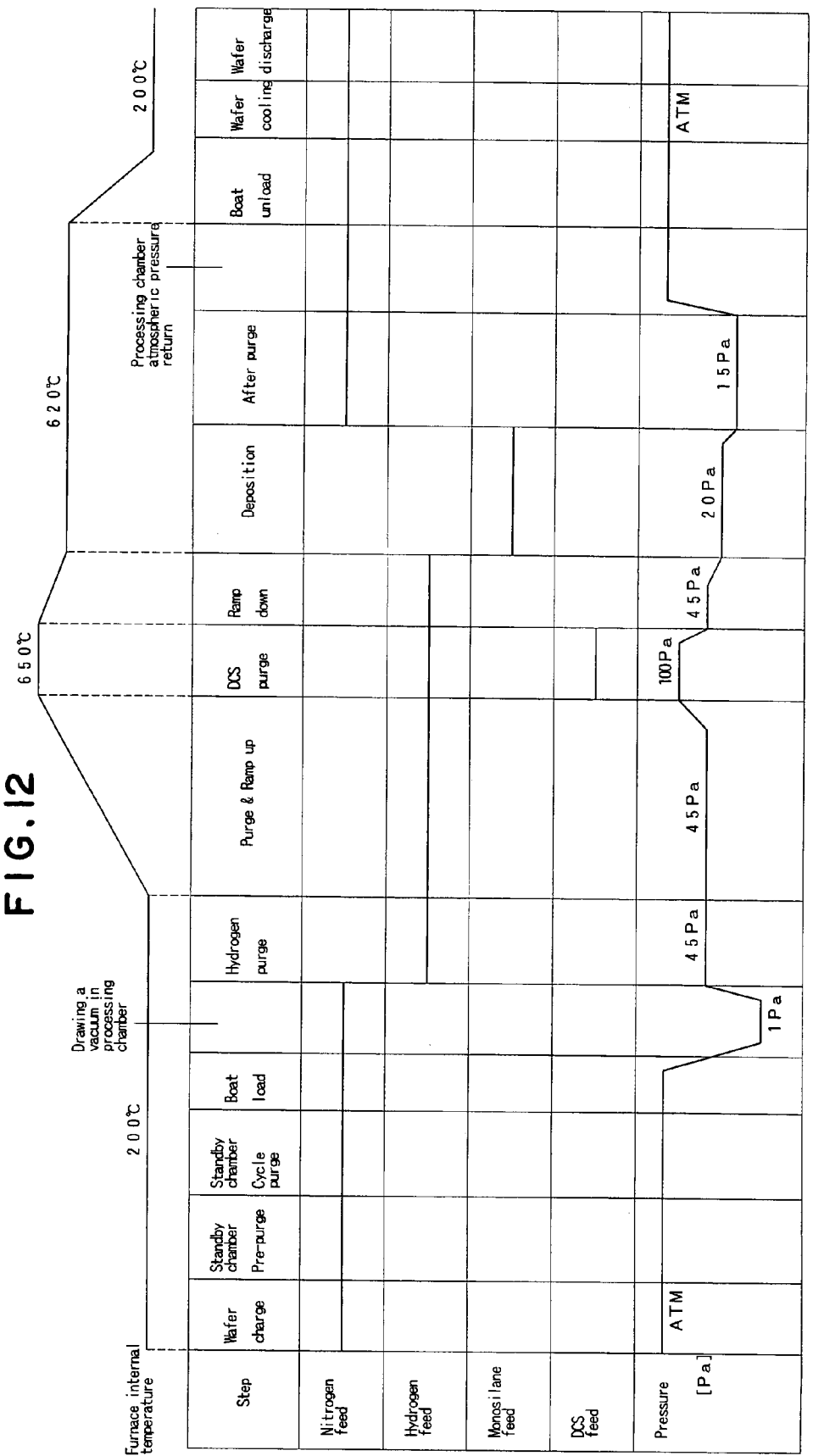
FIG. 12 is a timing chart showing the fifth embodiment of the process sequence including the pretreating step.

FIG. 12 shows the fifth embodiment in the processing sequence including the pretreating step.

The point where this fifth embodiment differs from the fourth embodiment is that dichlorosilane gas serving as the silane type gas containing halogen is utilized instead of monosilane as the gas for implementing the pretreating step.

The examples in the fourth embodiment and fifth embodiment utilize gas containing silicon atoms or gas containing chlorine atoms as the pretreating gas for the pretreating step.

The above described fourth embodiment and fifth embodiment render the following effects.

1) By continuously supplying hydrogen gas into the reaction furnace at least when a vacuum is drawn in the reaction furnace in the period from the end of the pretreating step to the start of the main process step, the contaminant substances removed in the pretreating can be prevented from, resettling on the wafer surface, and re-contaminating the wafer surface due to the exhaust system while a vacuum is drawn in the reaction furnace in the period from the end of the pretreating to the start of the main process.

2) By setting the temperature inside the reaction furnace to a first temperature when performing pretreating, and by setting the temperature inside the reaction furnace to a second temperature different from the first temperature when performing the main process, the contaminant substances removed by gas containing silicon atoms can be prevented from, resettling on the wafer surface, and re-contaminating the wafer surface due to the exhaust system when changing the temperature in the reaction furnace from the first temperature to the second temperature.

The effect of the second through the fifth embodiments is described next using the graphs in FIG. 13 through FIG. 16 obtained by testing.

Figure 13:
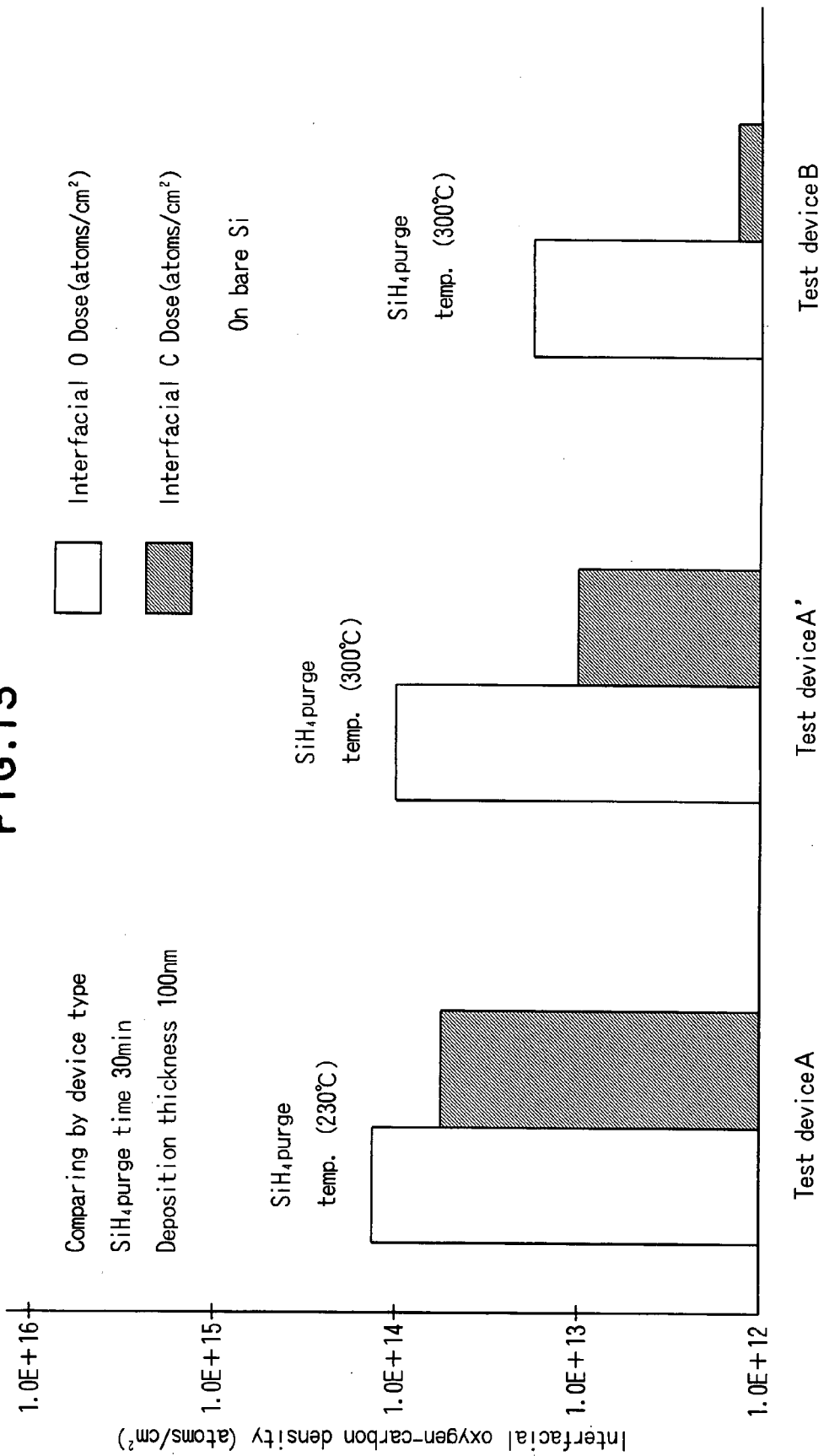
FIG. 13 is a graph showing the effect on reducing the interfacial oxygen-carbon density due to differences in the structure of the CVD apparatus.

FIG. 13 is a graph showing the effect on reducing the interfacial oxygen-carbon density due to differences in the structure of the CVD apparatus.

The horizontal axis indicates the three types of CVD apparatus used in the tests.

Test device A is a conventional CVD apparatus with a prechamber where the reaction furnace contains an outer tube and an inner tube; and the boat elevator is installed within the prechamber (standby chamber).

Test device A' is a CVD apparatus with prechamber, in which only the reaction furnace is the same as the reaction furnace 10 of the prior embodiment; and the boat elevator is installed within the prechamber.

Test device B is a CVD apparatus of the aforementioned embodiments where the boat elevator is installed outside the prechamber.

The vertical axis indicates the interfacial oxygen-carbon density (atoms/cm$^2$).

The white bar in the figure indicates the interfacial oxygen density. The shaded bar in the figure indicates the interfacial carbon density.

The test was performed as follows.

Namely, pretreating was performed in the sequence of the fourth embodiment, by setting the monosilane gas purge temperature for pretreating between 230 and 300° C., and the monosilane gas purge time to 30 minutes, and an epitaxial silicon film of approximately 100 nm formed after the pretreating.

The interfacial characteristics were measured with a SIMS (Secondary Ionization Mass Spectrometer).

The monosilane gas purge temperature is variable between 230 and 300° C. However, changes in the interfacial contamination density due to this temperature differential are slight compared to changes in interfacial contamination density due to these results and are therefore not taken into account here.

One can see that compared to the test device A, the test device A' in FIG. 13 was able to reduce the contaminant oxygen density by approximately 35 percent, and the carbon density by approximately 82 percent by utilizing a structure where just the reaction furnace was identical to the reaction furnace 10 of the aforementioned embodiments.

Compared to the test device A', one can see that in the test device B there was a drastic reduction in contaminants of approximately 89 percent in the oxygen density, and approximately 97 percent in the carbon density by utilizing a structure where the boat elevator 20 was installed outside the prechamber (standby chamber) 3 installed in a pre-stage of the reaction furnace 10.

Figure 14:
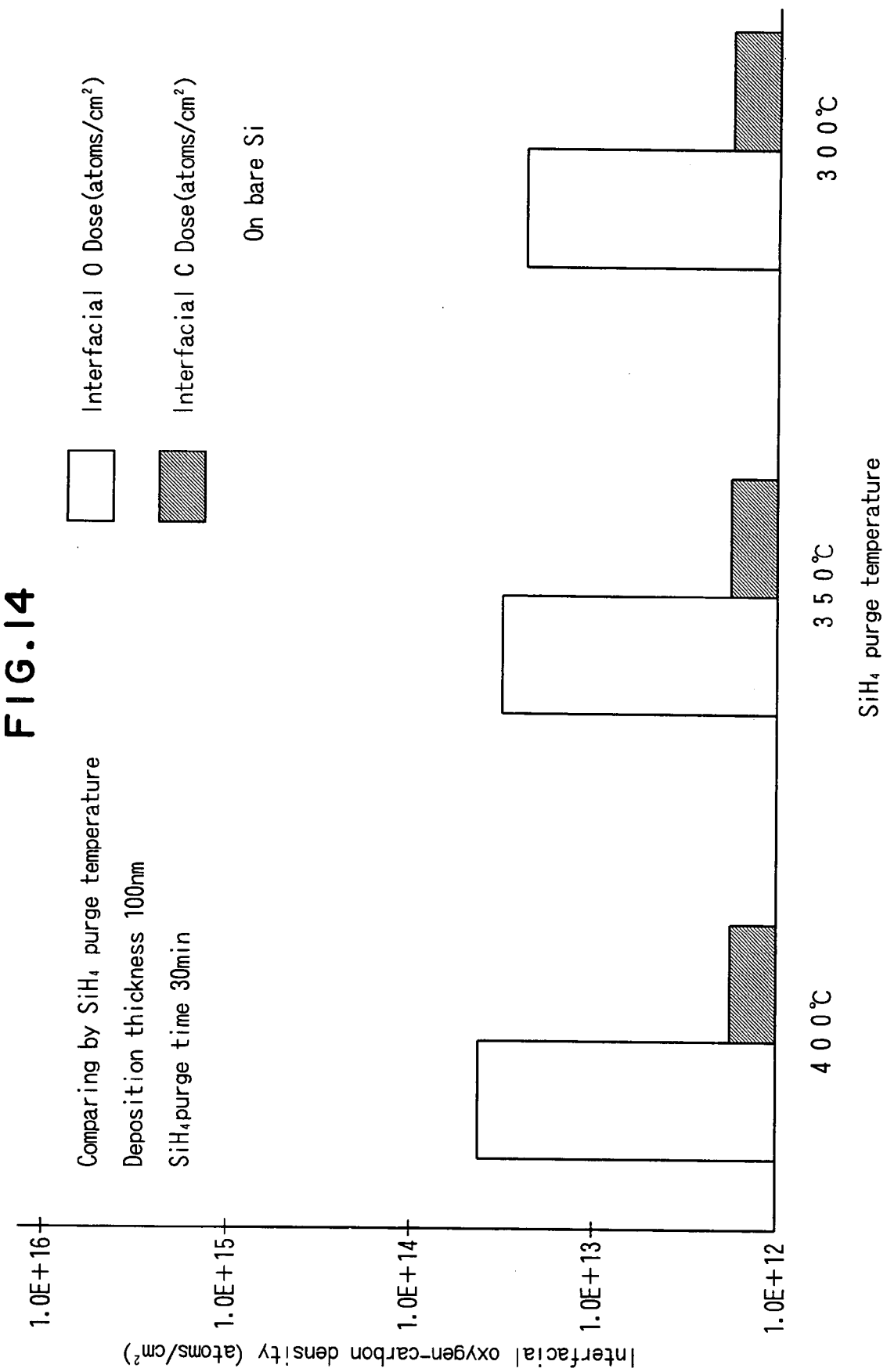
FIG. 14 is a graph showing the effect on reducing the interfacial oxygen-carbon density due to differences in the monosilane gas purge temperature.

FIG. 14 is a graph showing the effect on reducing the interfacial oxygen-carbon density obtained by differences in the monosilane gas purge temperature.

The horizontal axis indicates the monosilane gas purge temperature, and the vertical axis indicates the interfacial oxygen-carbon density.

This test device utilized a CVD apparatus of the aforementioned embodiments where the boat elevator was installed outside the prechamber. The test was performed as follows.

Namely, pretreating was performed in the sequence of the fourth embodiment by setting the monosilane gas purge temperature for pretreating between 300 and 400° C., and the monosilane gas purge time to 30 minutes, and an epitaxial silicon film of approximately 100 nm formed after the pretreating.

It can be observed in FIG. 14, that the low temperature among the monosilane gas purge temperatures was more effective in reducing the interfacial oxygen density, and that in the contaminant density the oxygen density was reduced approximately 54 percent by lowering the monosilane gas purge temperature from 400° C. to 300° C.

Figure 15:
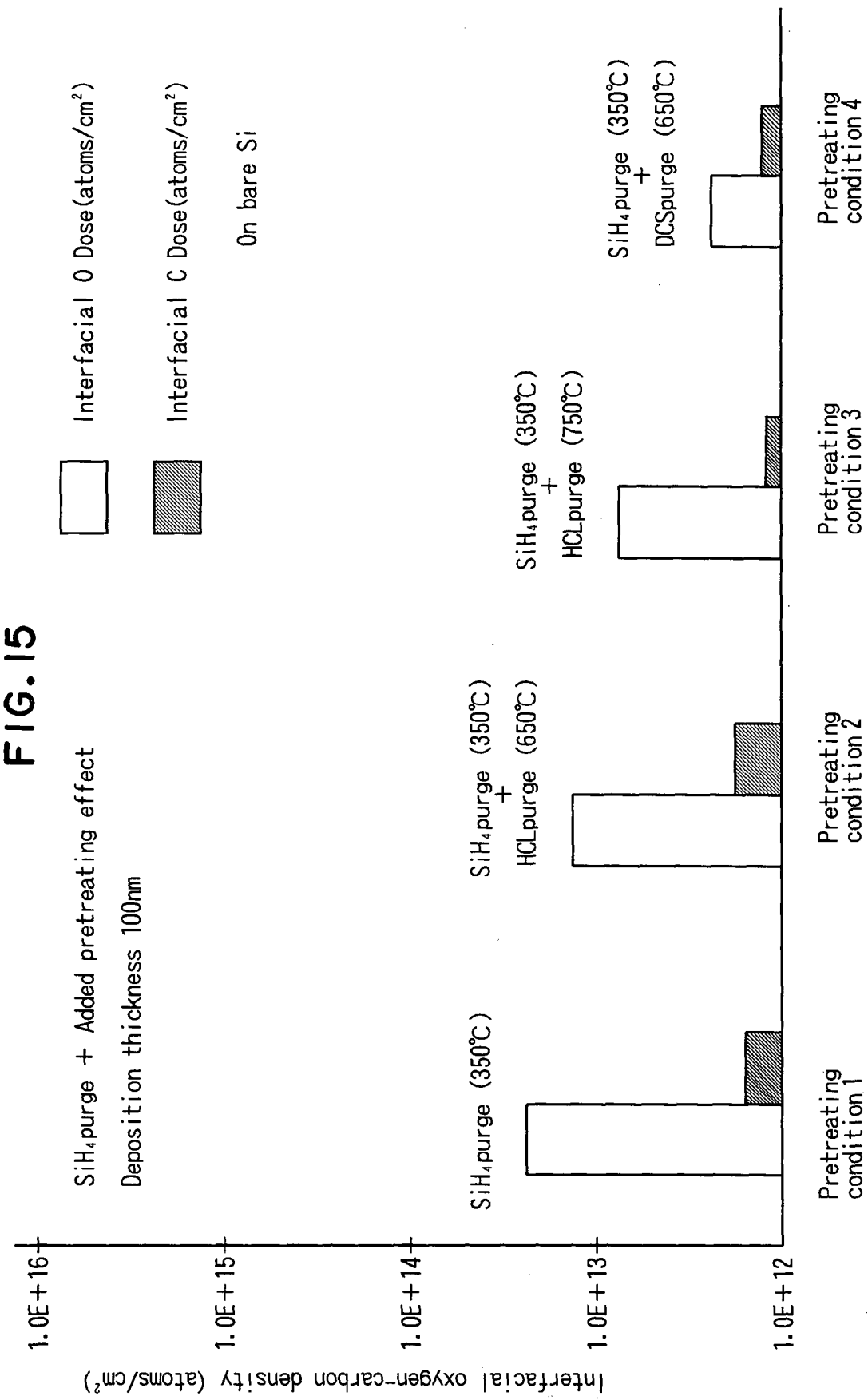
FIG. 15 is a graph showing the effect on reducing the interfacial oxygen-carbon density when hydrogen chloride gas purge or dichlorosilane gas purge was combined into the monosilane gas purge.

FIG. 15 is a graph showing the effect on reducing the interfacial oxygen-carbon density obtained by different combinations of hydrogen chloride gas purge or dichlorosilane gas purge with the monosilane gas purge as the pretreating process.

The horizontal axis indicates pretreating conditions, and the vertical axis indicates the interfacial oxygen-carbon density.

This test device utilized a CVD apparatus of the aforementioned embodiments where the boat elevator was installed outside the prechamber.

The test was performed as follows.

(Pretreating Condition 1)

Pretreating was performed in the sequence of the fourth embodiment by setting the monosilane gas purge temperature for pretreating to 350° C., and the monosilane gas purge time to 30 minutes, and an epitaxial silicon film of approximately 100 nm formed after the pretreating.

(Pretreating Condition 2)

Pretreating was performed in the sequence of the second embodiment by setting the monosilane gas purge temperature for pretreating to 350° C., and the monosilane gas purge time to 30 minutes, the hydrogen chloride gas purge temperature to 650° C., and the hydrogen chloride gas purge time to 30 minutes, and an epitaxial silicon film of approximately 100 nm then formed after the pretreating.

(Pretreating Condition 3)

Pretreating was performed in the sequence of the second embodiment by setting the monosilane gas purge temperature for pretreating to 350° C., and the monosilane gas purge time to 30 minutes, the hydrogen chloride gas purge temperature to 750° C., and the hydrogen chloride gas purge time to 30 minutes, and an epitaxial silicon film of approximately 100 nm then formed after the pretreating.

(Pretreating Condition 4)

Pretreating was performed in the sequence of the third embodiment by setting the monosilane gas purge temperature for pretreating to 350° C., the monosilane gas purge time to 30 minutes, the dichlorosilane gas purge temperature to 650° C., the dichlorosilane gas purge time to 30 minutes, and an epitaxial silicon film of approximately 100 nm then formed after the pretreating.

Combining a hydrogen chloride gas purge with a monosilane gas purge as shown in FIG. 15, and setting the hydrogen chloride gas purge temperature to 750° C. (pretreating condition 3) was found to render a greater effect in reducing the interfacial oxygen-carbon density than a temperature of 650° C. (pretreating condition 2), and was found to further reduce the contaminant level to an oxygen density of approximately 72 percent, and a carbon density of approximately 36 percent, compared to when using only a monosilane gas purge at 350° C. (pretreating condition 1).

Combining a dichlorosilane gas purge with a monosilane gas purge, and setting the dichlorosilane gas purge temperature to 650° C. (pretreating condition 4) was found to further lower the contaminant level, reducing the oxygen density by approximately 92 percent and the carbon density by approximately 31 percent compared to when only using a monosilane gas purge at 350° C. (pretreating condition 1).

The difference in reduction effect due to these pretreating temperatures is due to differences in the heat breakdown temperatures of the pretreating gas.

If using monosilane gas for example, thermal decomposition causes silane molecules of Si—H bonds, and Si or H atoms or molecules at a temperature in the vicinity of 250° C. to induce a cleaning effect by bonding with $H_2O$ physically attached to the surface or with $O_2$ or $H_2O$ in the atmosphere.

When hydrogen chloride gas and dichlorosilane gas, the substances occurring due to thermal decomposition in the vicinity of 650° C., bond with the $H_2O$ or $O_2$ or C attached to the wafer surface or remaining in the atmosphere within the processing chamber to render the cleaning effect.

In other words, when a hydrogen chloride gas purge or a dichlorosilane gas purge was combined with a monosilane gas purge, there was a greater effect in reducing carbon atoms and oxygen atoms because the cleaning step using mainly silicon atoms and the cleaning step using mainly chlorine atoms were performed separately in different temperature ranges (two stages).

Figure 16:
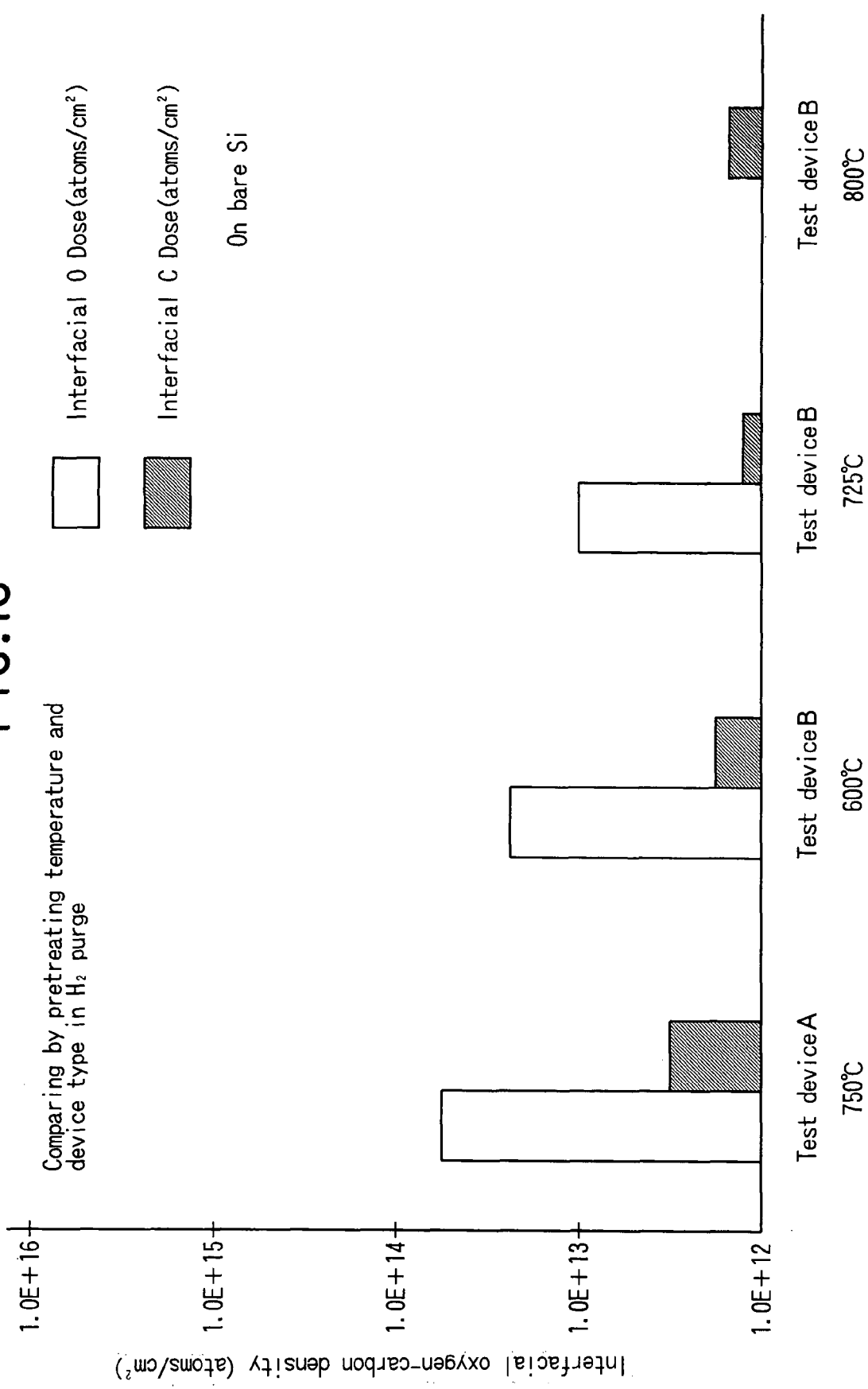
FIG. 16 is a graph showing effects on the interfacial oxygen-carbon density due to differences in the structure of the CVD apparatus and hydrogen gas purge temperature.

FIG. 16 is a graph showing the effect from different CVD apparatus structures and hydrogen gas purge temperatures for the interfacial oxygen-carbon density.

The horizontal axis indicates the hydrogen gas purge temperatures and the type of CVD apparatus.

Test device A is a conventional CVD apparatus with a prechamber where the reaction furnace contains an outer tube and an inner tube; and the boat elevator is installed within the prechamber (standby chamber).

Test device B is a CVD apparatus of the aforementioned embodiments where the boat elevator is installed outside the prechamber.

The vertical axis indicates the interfacial oxygen-carbon density. The test was performed as follows.

Pretreating in other words performed only a hydrogen gas purge. The hydrogen gas purge temperature was changed between 600 to 800° C. The hydrogen gas purge time was set to 30 minutes, and an epitaxial silicon film of approximately 100 nm was formed after pretreating.

FIG. 16 reveals that a high hydrogen gas purge temperature has a greater effect in reducing the interfacial oxygen density, and that when the hydrogen gas purge temperature was set to 800° C., and a CVD apparatus of the aforementioned embodiments with the boat elevator installed outside the prechamber was utilized, the interfacial oxygen density was then below the detection threshold, and an extremely high quality interface with absolutely no oxygen was formed.

Moreover, when using the CVD apparatus of the aforementioned embodiment with the boat elevator outside the prechamber, even at a comparatively low hydrogen gas purge temperature of 600° C., it was found that the effect in reducing the interfacial oxygen-carbon density was higher than the 750° C. hydrogen gas purge in the test device A; with the contaminant oxygen density reduced by approximately 64 percent and the carbon density reduced by approximately 45 percent.

Figure 17:
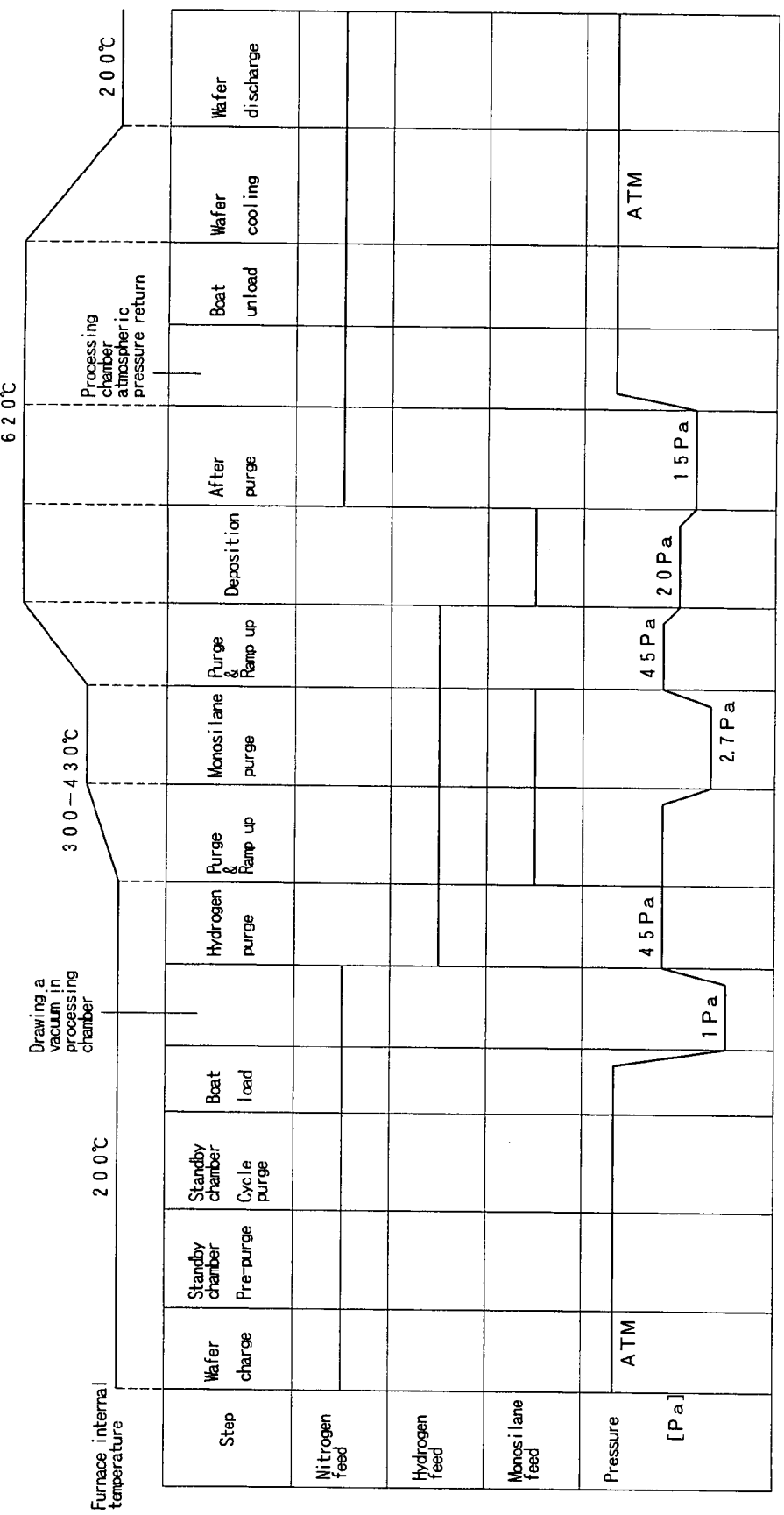
FIG. 17 is a timing chart showing the sixth embodiment of the process sequence including the pretreating step.

FIG. 17 is a graph showing the sixth embodiment of the process sequence including the pretreating step.

The sixth embodiment differs from the fourth embodiment (FIG. 11) in the point that the supply of monosilane gas as the pretreating gas into the interior of the processing chamber 13 starts when the temperature in the processing chamber 13 is raised from the temperature during boat loading up to the pretreating temperature after boat loading.

In other words, in the sixth embodiment, monosilane gas is supplied into the processing chamber 13 not only during the pretreating step, but also in the temperature raising step where the temperature in the processing chamber 13 was raised to the pretreating temperature.

More specifically, the operation flow is as follows.

Namely, a vacuum is drawn in the processing chamber 13 after loading of the boat 7 into the processing chamber 13, and hydrogen gas is filled into the processing chamber 13.

The temperature inside the processing chamber 13 is then raised up to the pretreating temperature, while maintaining the supply of hydrogen gas into the processing chamber 13.

The supply of monosilane gas into the processing chamber 13 starts from the time of this temperature rise.

The supply of hydrogen gas and monosilane gas into the processing chamber 13 continues even after the temperature in the processing chamber 13 reaches the pretreating temperature, and pretreating is performed.

The supply of monosilane gas stops after pretreating in a state where hydrogen gas is still being supplied, and pretreating ends.

By supplying monosilane gas as well as hydrogen gas into the processing chamber 13 when raising the temperature in the processing chamber 13 up to the pretreating temperature, the O, C and $H_2O$ eliminated at comparatively low temperature parts during the temperature rise can be trapped efficiently compared to when only hydrogen gas is flowing, and removed without adhering to the wafer. Moreover, O, C and $H_2O$ that remains on or adheres to the wafer can also be efficiently removed, so that the pretreating effect is further enhanced.

Figure 18:
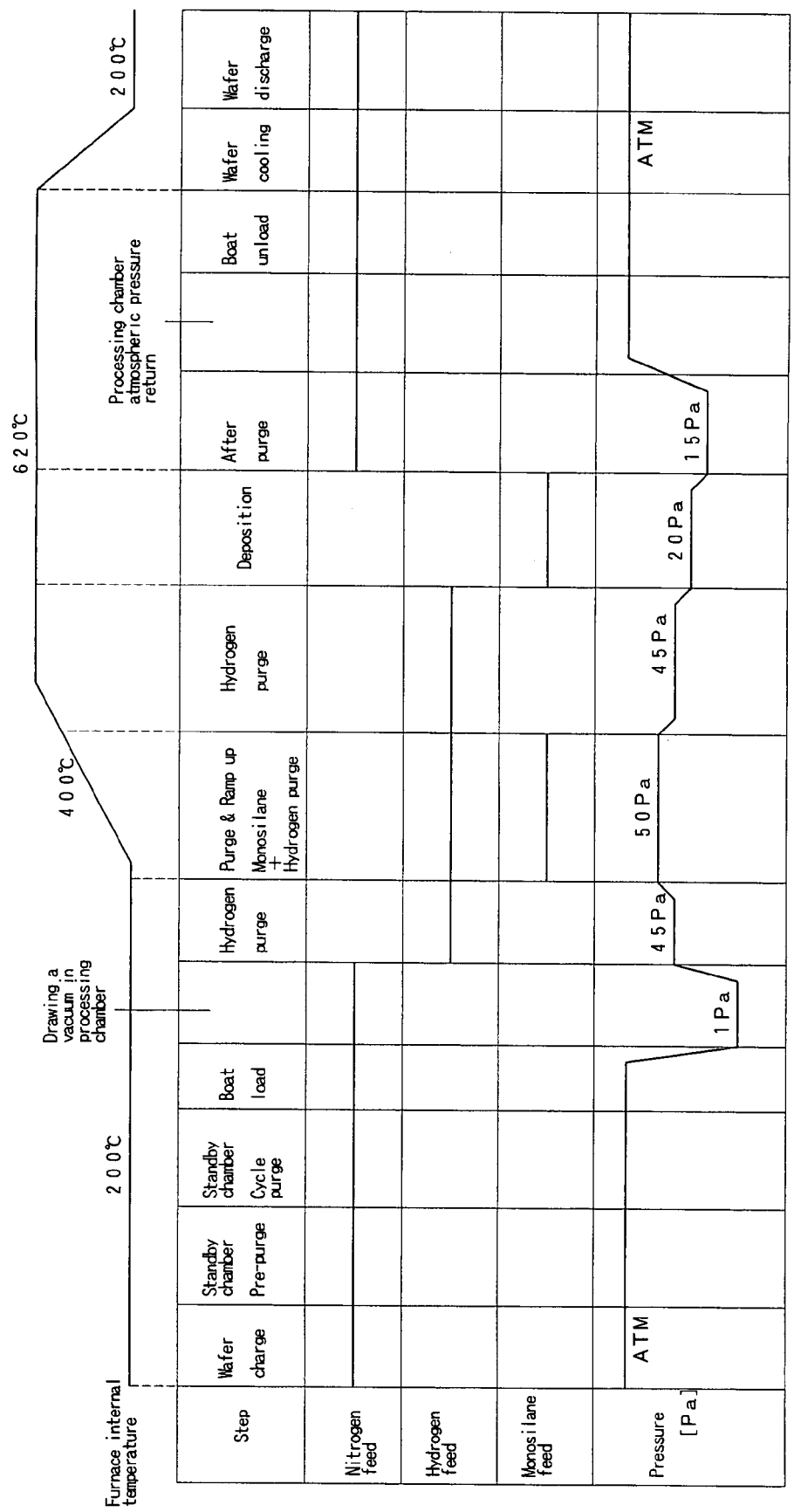
FIG. 18 is a timing chart showing the seventh embodiment of the process sequence including the pretreating step.

FIG. 18 is a graph showing the seventh embodiment of the process sequence including the pretreating step.

The seventh embodiment differs from the sixth embodiment (FIG. 17) in the point that during the pretreating step using hydrogen gas and monosilane gas, the temperature in the processing chamber 13 is raised rather than being maintained at a fixed temperature.

More specifically, the operation flow is as follows.

Namely, a vacuum is drawn in the processing chamber 13 after loading of the boat 7 into the processing chamber 13, and hydrogen gas is filled into the processing chamber 13.

The temperature inside the processing chamber 13 is then raised up to the main processing temperature, while maintaining the supply of hydrogen gas into the processing chamber 13.

The supply of monosilane gas into the processing chamber 13 starts when this temperature rise begins.

The hydrogen gas and monosilane gas continue to be supplied into the processing chamber 13 while the temperature continues rising even after the temperature in the processing chamber 13 has reached a temperature that allows pretreating, and the pretreating is then performed.

When the temperature in the processing chamber 13 reaches for example a temperature of 400° C., then the supply of monosilane gas stops in a state where hydrogen gas is still being supplied, and pretreating ends.

Then, temperature inside the processing chamber 13 is raised, and the main processing is performed after the temperature in the processing chamber 13 has reached the main processing temperature.

However, when pretreating while the temperature in the processing chamber 13 is maintained at a comparatively low temperature, namely a fixed temperature in a range between 200° C. and 430° C., then the C which is comparatively hard to trap during the pretreating might attach to the low temperature parts and remain on the wafer.

In that case, the wafer temperature can be raised during pretreating, when performing the pretreating while raising the temperature in the processing chamber 13 as in this embodiment, so that the C which is comparatively prone to attach to the low temperature parts can be removed before it adheres to the wafer.

In other words, this embodiment particularly can efficiently remove the C which is comparatively hard to trap and reduce the amount of C adhering to the wafer surface.

Figure 19:
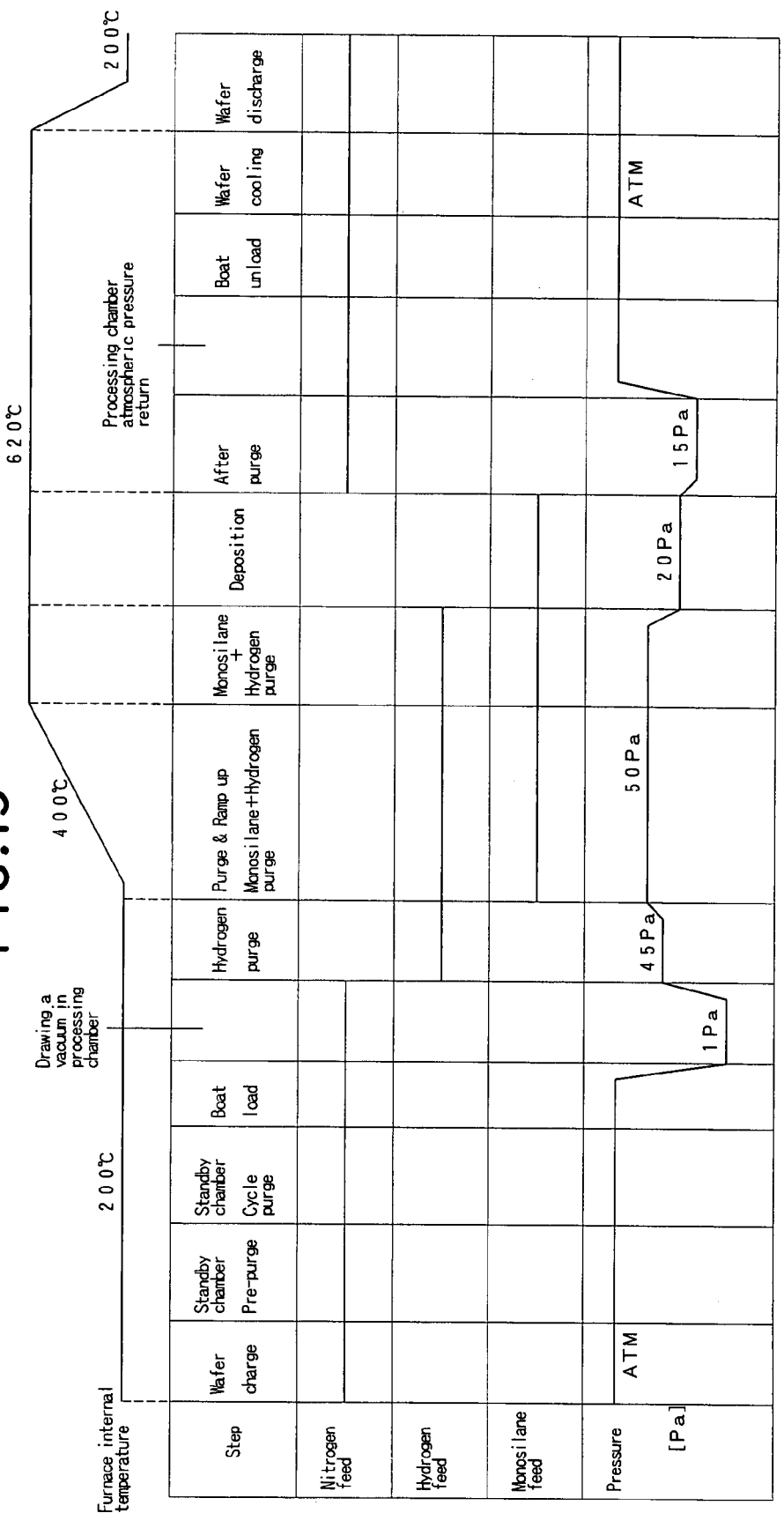
FIG. 19 is a timing chart showing the eighth embodiment of the process sequence including the pretreating step.

FIG. 19 is a graph showing the eighth embodiment of the process sequence including the pretreating step.

The eighth embodiment differs from the seventh embodiment (FIG. 18) in the point that the supply of monosilane gas is continuously supplied into the processing chamber 13 in the period from the start of the temperature raising step where the temperature in the processing chamber 13 is raised to the main processing temperature to the end of the main processing step.

More specifically, the operation flow is as follows.

Namely, a vacuum is drawn in the processing chamber 13 after loading of the boat 7 into the processing chamber 13, and hydrogen gas is filled into the processing chamber 13.

The temperature inside the processing chamber 13 is then raised up to the main processing temperature, while maintaining the supply of hydrogen gas into the processing chamber 13.

The supply of monosilane gas into the processing chamber 13 starts from the time of this temperature rise. The pretreating is performed during this temperature rise process.

The hydrogen gas and monosilane gas continue to be supplied into the processing chamber 13 for a while (specified time) even after the temperature in the processing chamber 13 has reached the main processing temperature.

After the specified time has elapsed, the main processing is performed by stopping the supply of hydrogen gas while maintaining the supply of monosilane gas.

In this embodiment, the pretreating is performed while raising the temperature inside the processing chamber 13 so that the same effect as the seventh embodiment is obtained.

The monosilane gas is continuously supplied into the processing chamber 13 in the period from the start of the temperature raising step of raising the temperature inside the processing chamber 13 to the main processing temperature to the end of the main processing step. The interfacial oxygen density can therefore be reduced by removing the residual oxygen and moisture in the atmosphere within the processing chamber 13 by means of the $SiH_4$, until immediately prior to forming the film.

The natural oxidation film and impurities on the silicon wafer can be removed and a high quality interface with a low oxygen-carbon density can be formed by utilizing the CVD apparatus and IC manufacturing method of the present invention, even without pretreating at a comparatively high temperature (900 to 1,000° C.) using hydrogen gas.

The present invention is not limited by the above described embodiments and may include changes and variations not departing from the scope or spirit of this invention.

The above embodiments for example described forming a polysilicon film on the wafer, however, the present invention is not limited to a polysilicon film and may also apply to the forming of monocrystalline film, polycrystalline film, amorphous film, or doped monocrystalline film, doped polycrystalline film, doped amorphous film, or nitrided film, or oxidized film, or metallic films.

The description in the above embodiments utilized a CVD apparatus, however, the present invention is not limited to a CVD apparatus and can apply to substrate processing devices in general.

This invention yields an excellent effect when applied in particular when a high quality interface must be formed between the substrate and the thin film.

The invention claimed is:

1. A method for manufacturing semiconductor devices comprising the steps of:
    loading a substrate into a reaction furnace,
    supplying silane type gas into the reaction furnace and pretreating the substrate to remove by reduction oxidized film on the substrate during a pretreating step,
    supplying process gas into the reaction furnace and performing a main processing of the pretreated substrate during a main processing step to form a film on the pretreated substrate, and
    unloading the substrate from the reaction furnace after the main processing step, wherein
    hydrogen gas is continuously supplied into the reaction furnace at least during vacuum-exhausting an interior of the reaction furnace in the period from the end of the pretreating step to the start of the main processing step, and the temperature inside the reaction furnace is set between 200 C. and 430 C. to remove the oxidized film by the silane type gas during the pretreating step, and the pressure inside the reaction furnace is set between 1 Pa and 10 Pa.

2. The method for manufacturing semiconductor devices according to claim 1, wherein hydrogen gas is continuously supplied into the reaction furnace in the period between the end of the pretreating step and the start of the main processing step.

3. The method for manufacturing semiconductor devices according to claim 1, wherein the temperature inside the reaction furnace is set to a first temperature during the pretreating step, and is set to a second temperature different from the first temperature during the main processing step.

4. The method for manufacturing semiconductor devices according to claim 1, further containing a step of raising the temperature inside the reaction furnace to the pretreating temperature after loading the substrate into the reaction furnace, wherein the pretreating gas is supplied into the reaction furnace in this temperature raising step.

5. The method for manufacturing semiconductor devices according to claim 1, wherein the pretreating step is performed while raising the temperature in the reaction furnace.

6. The method for manufacturing semiconductor devices according to claim 1, wherein gas containing silicon atoms and gas containing chlorine atoms are alternately supplied into the reaction furnace as the pretreating gas in the pretreating step.

7. A method for manufacturing semiconductor devices comprising the steps of:
loading a substrate into a reaction furnace,
pretreating the substrate in the reaction furnace in a pretreating step to remove by reduction oxidized film on the substrate,
performing a main processing of the pretreated substrate in the reaction furnace in a main processing step to form a film on the pretreated substrate, and
unloading the substrate from the reaction furnace after the main processing step, wherein gas containing silicon atoms and gas containing chlorine atoms are alternately supplied into the reaction furnace in the pretreating step, and the temperature inside the reaction furnace is set between 200 C. and 430 C. to remove the oxidized film by the silane type gas during the pretreating step, and the pressure inside the reaction furnace is set between 1 Pa and 10 Pa.

8. The method for manufacturing semiconductor devices according to claim 7, wherein the gas containing silicon atoms is at least one gas selected from among a group made up of monosilane ($SiH_4$) gas and disilane ($Si_2H_6$) gas; and the gas containing chorine atoms is at least one gas selected from among a group made up of hydrogen chloride (HCI) gas and dichlorosilane ($SiH_2CI_2$) gas.

9. A method for manufacturing semiconductor devices comprising the steps of:
loading a substrate into a reaction furnace,
pretreating the substrate in the reaction furnace in a pretreating step to remove by reduction oxidized film on the substrate,
performing a main processing of the pretreated substrate in the reaction furnace in a main processing step to form a film on the pretreated substrate, and
unloading the substrate from the reaction furnace after the main processing step, wherein
gas containing silicon atoms and gas containing chlorine atoms arc alternately supplied into the reaction furnace in the pretreating step, and
in the pretreating step, the temperature inside the reaction furnace is set to a first temperature when supplying gas containing silicon atoms into the reaction furnace, and is set to a second temperature different from the first temperature when supplying gas containing chlorine atoms into the reaction furnace.

10. The method for manufacturing semiconductor devices according to claim 9, wherein the temperature inside the reaction furnace is set to a third temperature different from the second temperature in the main processing step.

11. The method for manufacturing semiconductor devices according to claim 10, wherein hydrogen gas is continuously supplied into the reaction furnace when changing the reaction furnace temperature from the first temperature to the second temperature, and when changing the reaction furnace temperature from the second temperature to the third temperature.

12. The method for manufacturing semiconductor devices according to claim 9, wherein hydrogen gas is continuously supplied into the reaction furnace when changing the reaction furnace temperature from the first temperature to the second temperature.

13. A method for manufacturing semiconductor devices comprising the steps of:
loading a substrate into a reaction furnace,
supplying silane type gas into the reaction furnace and pretreating the substrate during a pretreating step to remove by reduction oxidized film on the substrate,
supplying process gas into the reaction furnace and performing a main processing of the pretreated substrate during a main processing step to form a film on the pretreated substrate, and
unloading the substrate from the reaction furnace after the main processing step, wherein
in the pretreating step, the temperature inside the reaction furnace is set between 200 C. and 430 C. to remove the oxidized film by the silane type gas, and the pressure inside the reaction furnace is set between 1 Pa and 10 Pa.

* * * * *